(12) United States Patent
Basak et al.

(10) Patent No.: US 11,072,870 B2
(45) Date of Patent: Jul. 27, 2021

(54) CRYSTAL PULLING SYSTEMS AND METHODS FOR PRODUCING MONOCRYSTALLINE INGOTS WITH REDUCED EDGE BAND DEFECTS

(71) Applicant: GlobalWafers Co., Ltd, Hsinchu (TW)

(72) Inventors: Soubir Basak, Chander, AZ (US); Gaurab Samanta, Brentwood, MO (US); Parthiv Daggolu, Creve Coeur, MO (US); Benjamin Michael Meyer, Defiance, MO (US); William L. Luter, St. Charles, MO (US); Jae Woo Ryu, Chesterfield, MO (US); Eric Michael Gitlin, St. Peters, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 16/237,071

(22) Filed: Dec. 31, 2018

(65) Prior Publication Data
US 2019/0136408 A1    May 9, 2019

Related U.S. Application Data

(62) Division of application No. 15/297,853, filed on Oct. 19, 2016.

(60) Provisional application No. 62/243,322, filed on Oct. 19, 2015.

(51) Int. Cl.
*C30B 15/20*   (2006.01)
*C30B 29/06*   (2006.01)
*C30B 15/14*   (2006.01)

(52) U.S. Cl.
CPC ............. *C30B 15/206* (2013.01); *C30B 15/14* (2013.01); *C30B 29/06* (2013.01)

(58) Field of Classification Search
CPC ........ C30B 15/14; C30B 15/206; C30B 29/06
See application file for complete search history.

(56) References Cited

U.S. PATENT DOCUMENTS

| | | | |
|---|---|---|---|
| 5,316,742 A | 5/1994 | Tomioka et al. | |
| 5,567,399 A | 10/1996 | Von Ammon et al. | |
| 6,036,776 A | 3/2000 | Kotooka et al. | |
| 6,117,402 A | 9/2000 | Kotooka et al. | |
| 6,579,362 B2 | 6/2003 | Ferry et al. | |
| 6,846,539 B2 | 1/2005 | Kim et al. | |
| 7,875,116 B2 | 1/2011 | Sadohara et al. | |
| 8,147,613 B2 | 4/2012 | Kulkarni | |

(Continued)

FOREIGN PATENT DOCUMENTS

| | | | | |
|---|---|---|---|---|
| CN | 101575731 A | 11/2009 | | |
| WO | 2007137182 A2 | 11/2007 | | |
| WO | WO-2015037831 A1 | * | 3/2015 | ............. C30B 15/14 |

*Primary Examiner* — Hua Qi
(74) *Attorney, Agent, or Firm* — Armstrong Teasdale LLP

(57) ABSTRACT

A crystal pulling system for growing a monocrystalline ingot from a melt of semiconductor or solar-grade material includes a crucible for containing the melt of material, a pulling mechanism configured to pull the ingot from the melt along a pull axis, and a multi-stage heat exchanger defining a central passage for receiving the ingot as the ingot is pulled by the pulling mechanism. The heat exchanger defines a plurality of cooling zones arranged vertically along the pull axis of the crystal pulling system. The plurality of cooling zones includes two enhanced-rate cooling zones and a reduced-rate cooling zone disposed vertically between the two enhanced-rate cooling zones.

19 Claims, 16 Drawing Sheets

(56) References Cited

U.S. PATENT DOCUMENTS

| | | |
|---|---|---|
| 8,673,248 B2 | 3/2014 | Kulkarni |
| 2002/0100410 A1* | 8/2002 | Kim .................. C30B 15/203 |
| | | 117/13 |
| 2007/0269361 A1* | 11/2007 | Kulkarni ............ C30B 15/20 |
| | | 423/324 |
| 2010/0107966 A1 | 5/2010 | Javidi et al. |
| 2011/0056427 A1* | 3/2011 | Soeta .................. C30B 15/14 |
| | | 117/14 |
| 2015/0020728 A1 | 1/2015 | Hoshi et al. |
| 2016/0017514 A1* | 1/2016 | Lee .................... C30B 29/06 |
| | | 117/217 |

* cited by examiner

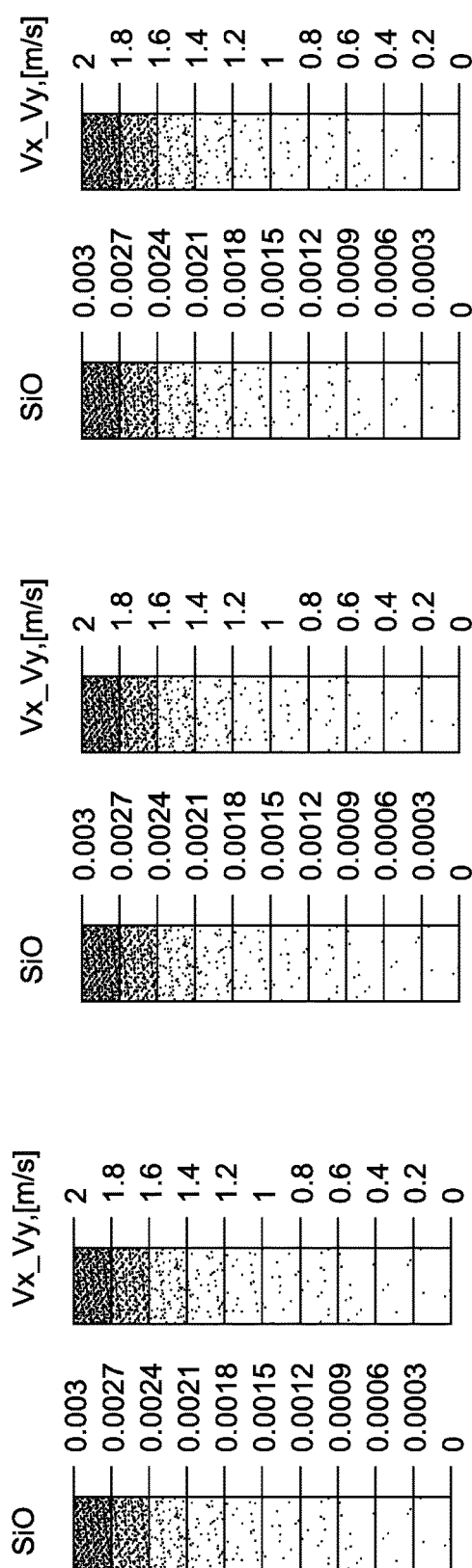
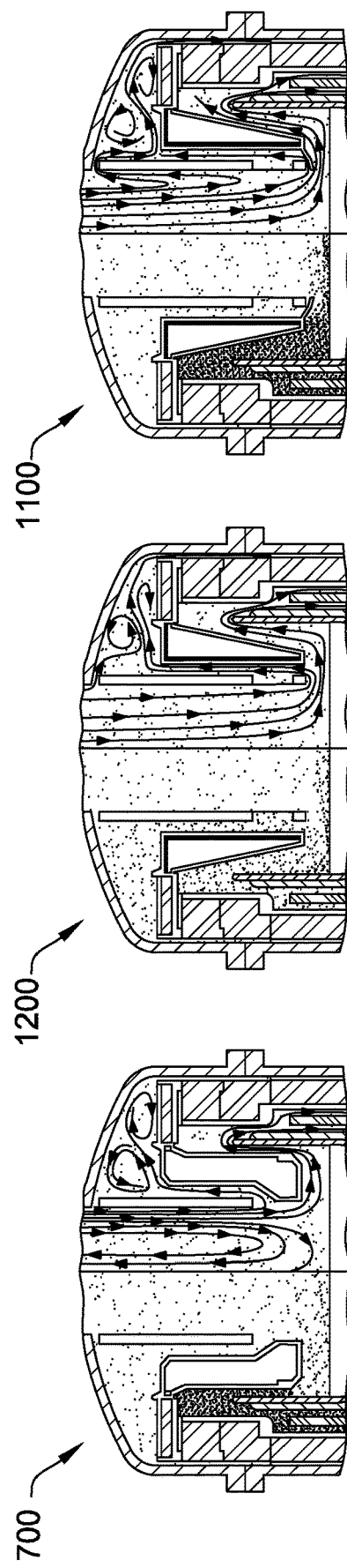
FIG. 13
FIG. 14
FIG. 15

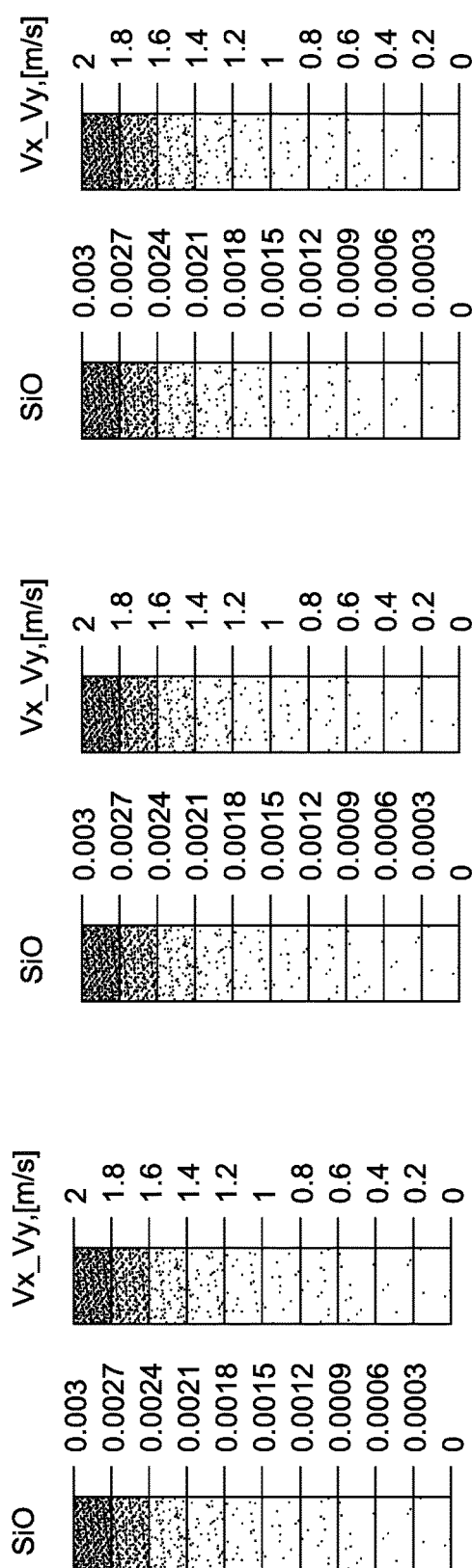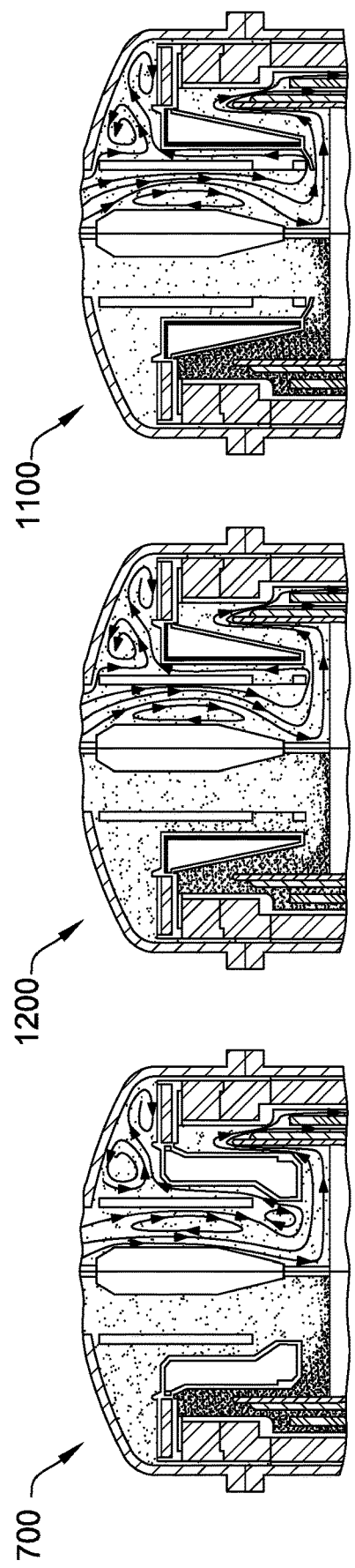
FIG. 16   FIG. 17   FIG. 18

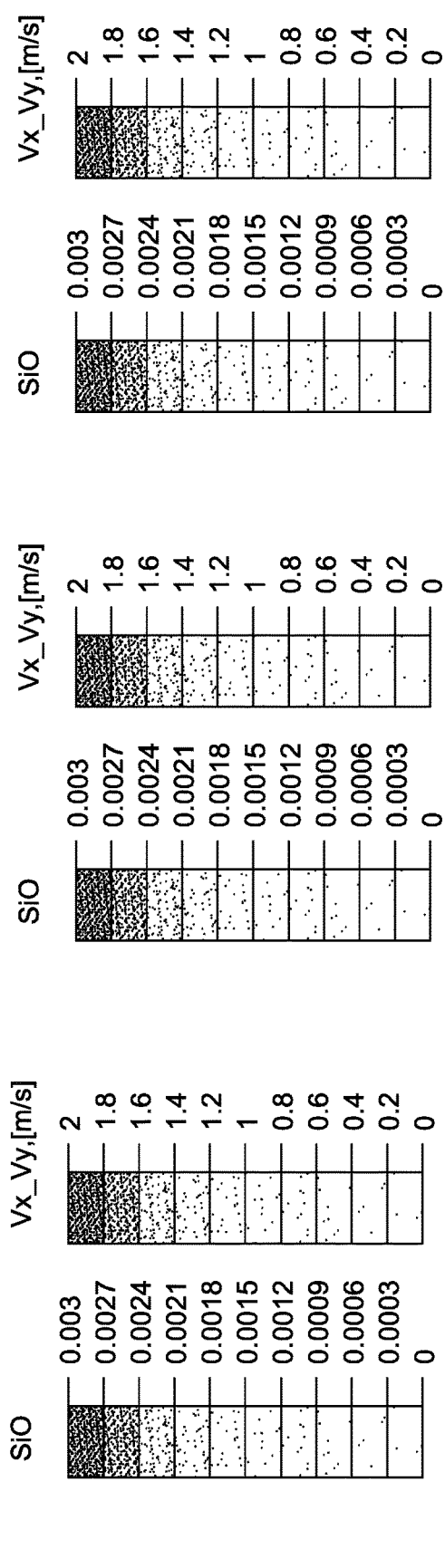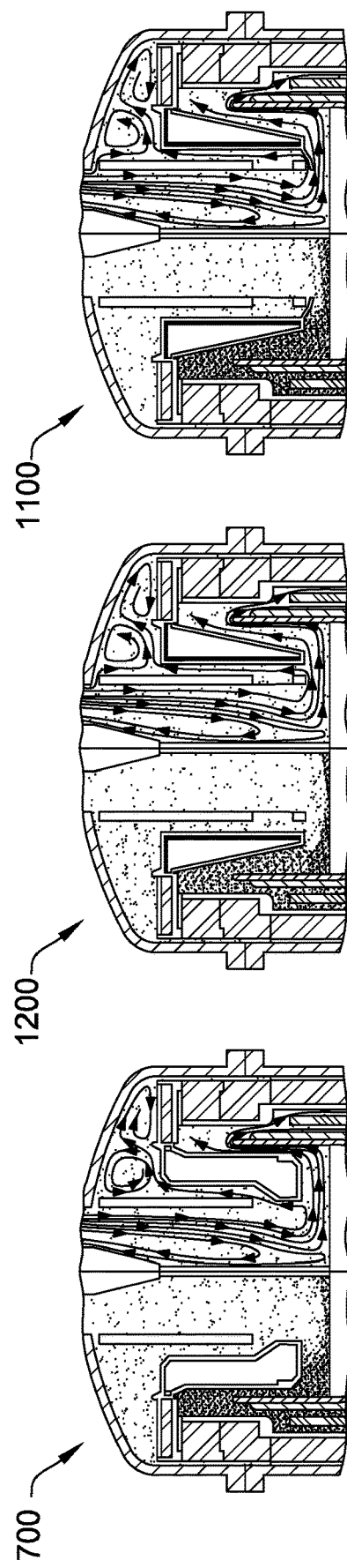
FIG. 19  FIG. 20  FIG. 21

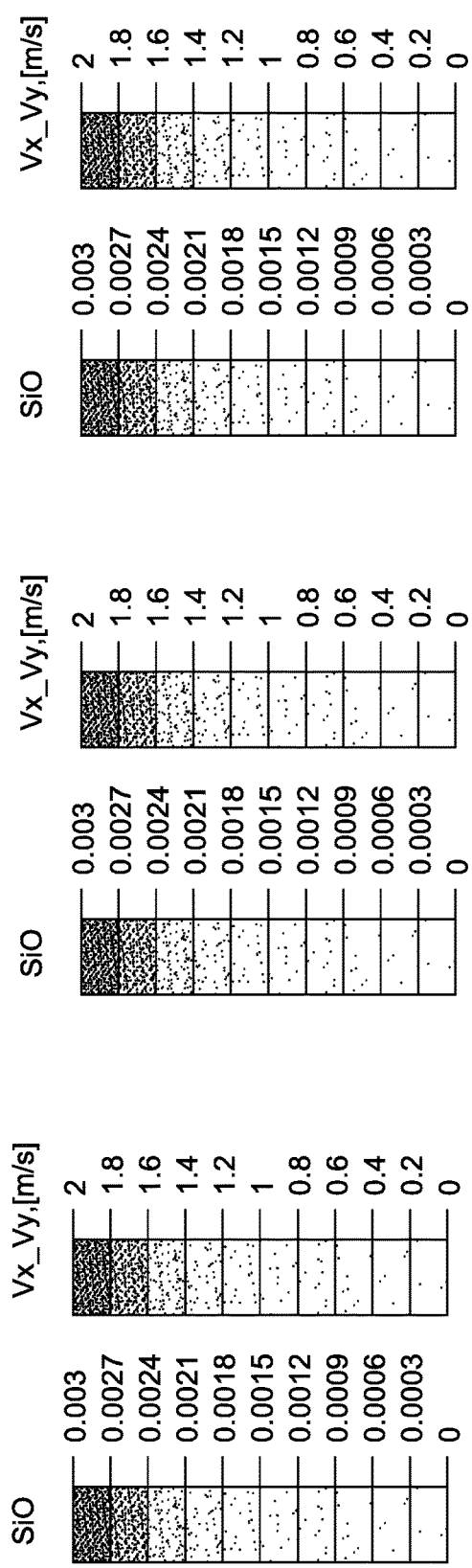
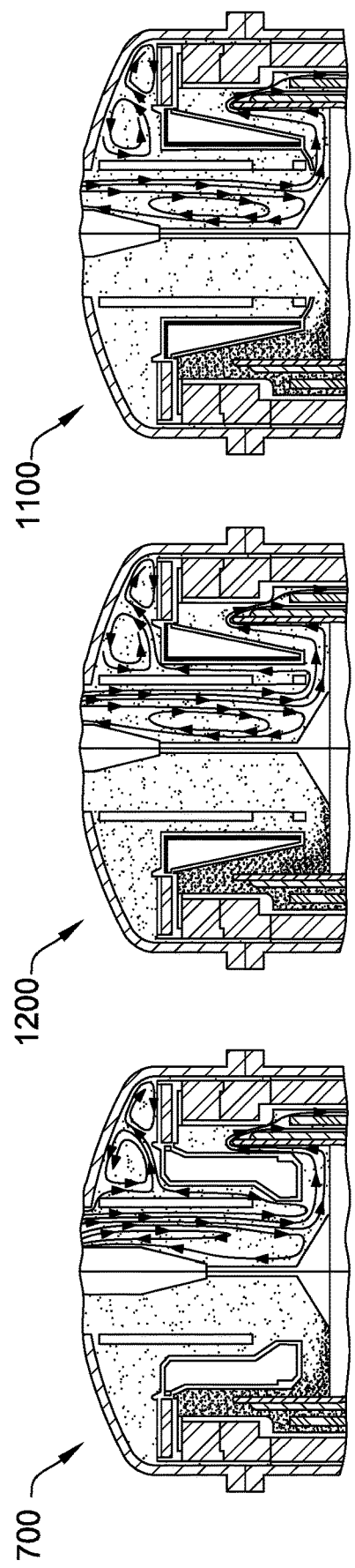
FIG. 22
FIG. 23
FIG. 24

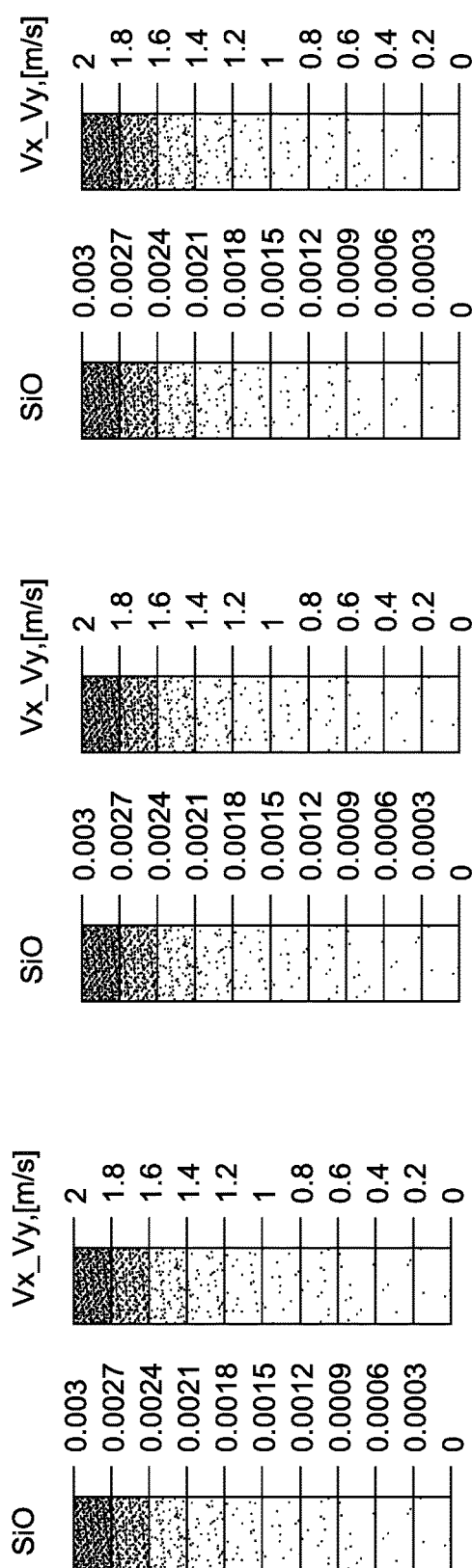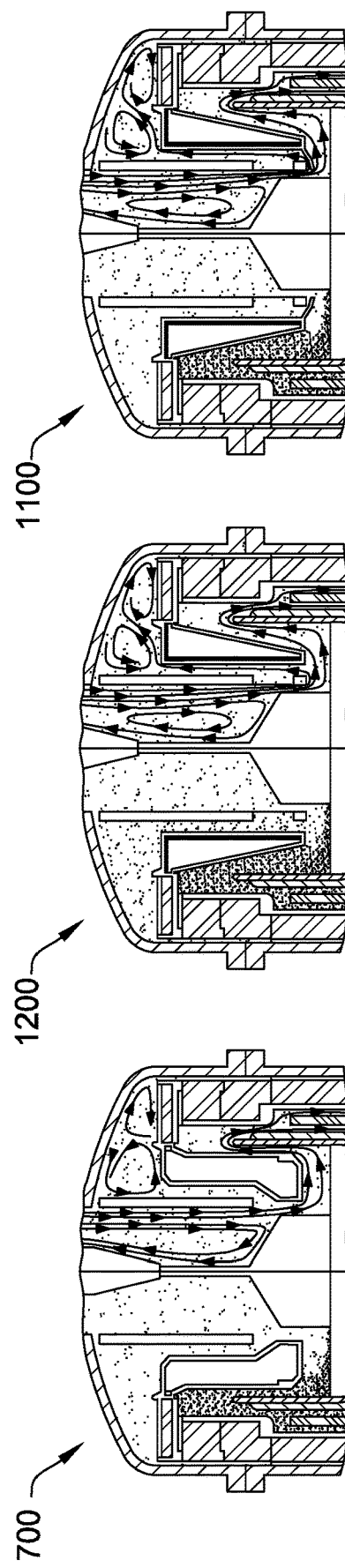
FIG. 25 FIG. 26 FIG. 27

CRYSTAL PULLING SYSTEMS AND METHODS FOR PRODUCING MONOCRYSTALLINE INGOTS WITH REDUCED EDGE BAND DEFECTS

CROSS-REFERENCE TO RELATED APPLICATIONS

This application is a divisional application of U.S. patent application Ser. No. 15/297,853, filed on Oct. 19, 2016, which claims priority to U.S. Provisional Patent Application Ser. No. 62/243,322, filed on Oct. 19, 2015, the disclosures of which are hereby incorporated by reference in their entirety.

FIELD

The field relates generally to preparation of single crystals of semiconductor or solar-grade material and, more specifically, to crystal pulling systems including heat exchangers and related methods for producing monocrystalline ingots with reduced edge band defects.

BACKGROUND

Single crystal material, which is the starting material for fabricating many electronic components such as semiconductor devices and solar cells, is commonly prepared using the Czochralski ("CZ") method. Briefly, the Czochralski method involves melting polycrystalline source material, such as polycrystalline silicon ("polysilicon"), in a crucible to form a silicon melt, and then pulling a single-crystal ingot from the melt.

The continuously shrinking size of modern electronic devices imposes challenging restrictions on the quality of the silicon substrate, which is determined, at least in part, by the size and the distribution of the grown-in microdefects. Most of the microdefects formed in silicon crystals grown by the Czochralski process are agglomerates of intrinsic point defects of silicon (i.e., vacancies and self-interstitials) or oxide precipitates.

Attempts to produce substantially defect-free single crystal silicon often include controlling the ratio of the crystal pull-rate (v) to the magnitude of the axial temperature gradient in the vicinity of the melt/crystal interface (G). For example, some known methods include controlling the v/G ratio near a critical v/G value at which vacancy and interstitial defects are incorporated into the growing crystal ingot in very low and comparable concentrations, mutually annihilating each other and thus suppressing the potential formation of any microdefects at lower temperatures. However, as described in U.S. Pat. No. 8,673,248 to Kulkarni, controlling the v/G ratio near such a critical v/G value may form an annular ring or "band" of relatively large and/or concentrated agglomerated defects (such as voids and oxygen precipitates) extending a distance radially inward from the lateral surface or circumferential edge of the silicon crystal ingot, referred to herein as a "defect edge band" or simply, "defect band".

Such a defect band is generally of lower quality than other portions of the silicon crystal ingot located radially inward from the defect band, and can significantly reduce the yield of the crystal ingot. For example, increasingly stringent requirements on the quality of wafers for memory devices have increased the required breakdown voltage for gate oxide integrity (GOI) tests, used to evaluate the quality of silicon or semiconductor wafers for application in memory devices (e.g., SRAM, DRAM). As a result, more GOI failures occur near or within the defect edge band of substantially defect-free silicon wafers, reducing the yield.

Known methods and crystal pulling systems for addressing and/or reducing the defect edge band in silicon or semiconductor crystal ingots have been less than optimal for certain applications. Accordingly, a need exists for crystal pulling systems and methods for producing monocrystalline ingots with fewer edge band defects and edge band defects having a smaller average size.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a crystal pulling system for growing a monocrystalline ingot from a melt of semiconductor or solar-grade material includes a crucible for containing the melt of semiconductor or solar-grade material, a pulling mechanism configured to pull the ingot from the melt along a pull axis, and a multi-stage cooling system configured to cool the ingot at different cooling rates as the ingot is pulled from the melt by the pulling mechanism. The cooling system includes an annular heat shield and a multi-stage heat exchanger. The heat shield is positioned concentric with the crucible and defines an elongate passage for receiving the ingot. The multi-stage heat exchanger is positioned within the passage defined by the heat shield, and including a fluid-cooled housing that defines a central passage for receiving the ingot. The housing has an upper portion and a lower portion spaced vertically from the upper portion by an annular gap.

In another aspect, a crystal pulling system for growing a monocrystalline ingot from a melt of semiconductor or solar-grade material includes a crucible for containing the melt of semiconductor or solar-grade material, a pulling mechanism configured to pull the ingot from the melt along a pull axis, and a multi-stage heat exchanger defining a central passage for receiving the ingot as the ingot is pulled by the pulling mechanism. The heat exchanger defines a plurality of cooling zones arranged vertically along the pull axis of the crystal pulling system. The plurality of cooling zones includes two enhanced-rate cooling zones and a reduced-rate cooling zone disposed vertically between the two enhanced-rate cooling zones.

In yet another aspect, a method of growing a monocrystalline ingot from a melt of semiconductor or solar-grade material includes preparing the melt of semiconductor or solar-grade material in a crucible, lowering a seed crystal into contact with the melt to initiate growth of the monocrystalline ingot, growing the monocrystalline ingot by pulling the seed crystal away from the melt, and controlling the cooling rate of the ingot by pulling the ingot through a multi-stage heat exchanger. Controlling the cooling rate of the ingot includes cooling an axial segment of the ingot at a first, initial cooling rate as the ingot is pulled from melt, cooling the axial segment of the ingot at a second cooling rate less than the first cooling rate as the ingot is pulled from the melt, and cooling the axial segment at a third cooling rate greater than the second cooling rate as the ingot is pulled from the melt.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

FIGS. 13-27 are schematic cross-sections of three different crystal pulling systems showing simulated SiO gas concentrations and gas flow velocities in the crystal pulling systems at different stages of the crystal growth process;

Corresponding reference characters indicate corresponding parts throughout the several views of the drawings.

DETAILED DESCRIPTION

The systems and methods of this disclosure facilitate reducing the size and concentration of defects that form the grown-in defect edge band in monocrystalline ingots grown by the Czochralski method, such as single crystal silicon ingots. In particular, the systems and methods described facilitate reducing the concentration and/or the size of defects incorporated into the crystal ingot during growth by reducing and/or controlling the lateral incorporation and transport of defects, such as vacancies and oxygen impurities, as the crystal ingot is grown from a melt. The systems and methods described also facilitate reducing the size of defects in crystal ingots by reducing and/or controlling the nucleation of agglomerated defects, such as voids and oxygen precipitates, as the crystal ingot is grown.

Additionally, the systems and methods of this disclosure facilitate reducing and/or controlling lateral incorporation and nucleation of defects by controlling the cooling rate of the ingot and by controlling the profile of the melt/crystal interface during growth of the crystal. In particular, the systems and methods described use a multi-stage cooling system (broadly, a temperature control system) that subjects the ingot to multiple different cooling rates as the ingot is pulled from the melt. Use of the multi-stage cooling system facilitates closely controlling the various transport and nucleation mechanisms of defects at various stages of crystal growth, and thereby facilitates reducing the size and/or concentration of defects incorporated into the crystal during growth. Moreover, the present disclosure provides a method for determining a desired or target melt/crystal interface profile for reducing and/or controlling lateral incorporation of defects, and for controlling process parameters during crystal growth to achieve the desired melt/crystal interface profile. Notably, the systems and methods described herein facilitate reducing the size of voids and oxygen precipitates in the grown-in edge band of substantially defect-free or "perfect-silicon" crystals without any post growth thermal treatment in crystal or wafer form.

Figure 1:
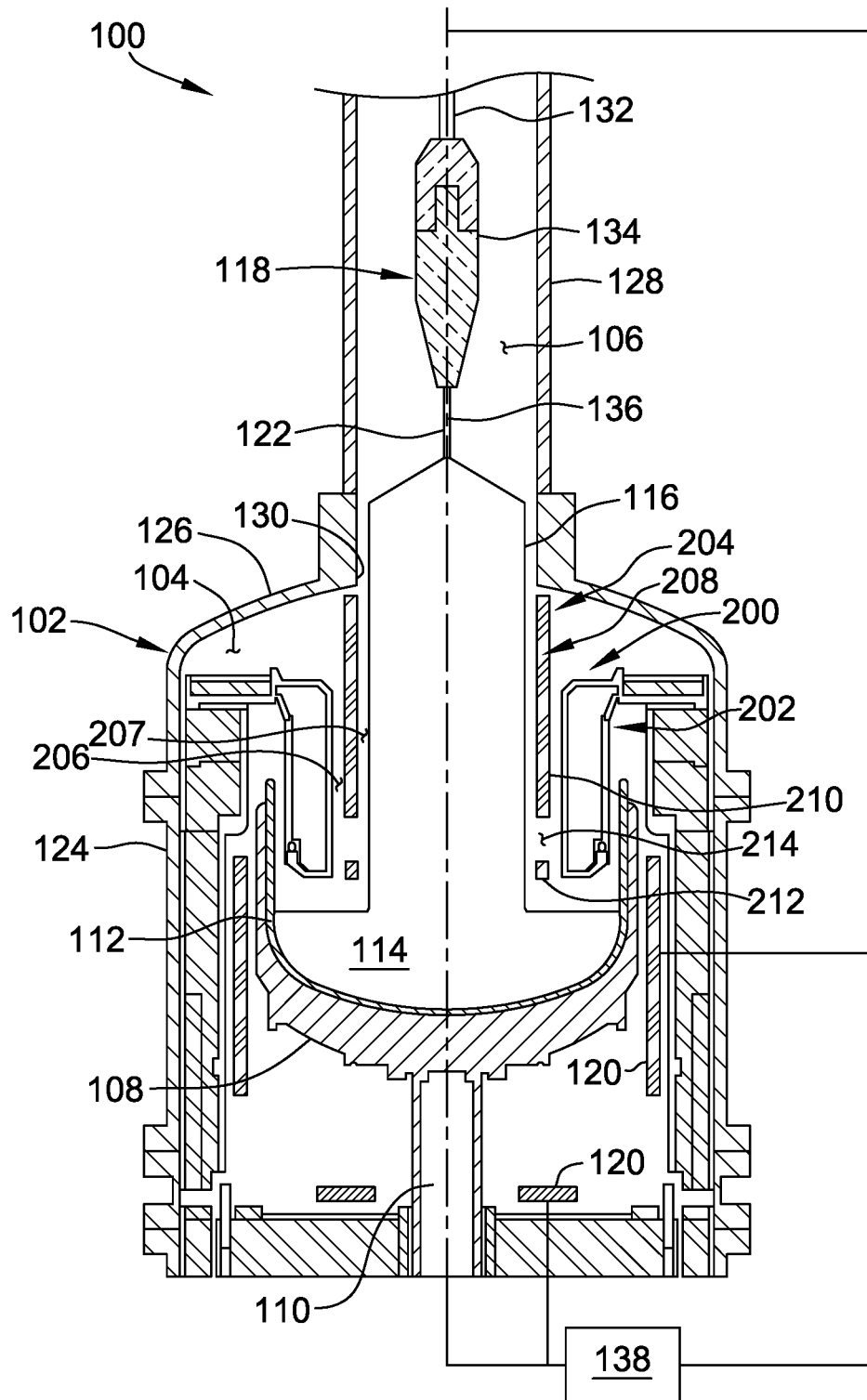
FIG. 1 is a schematic cross-section of a crystal pulling system including one embodiment of a cooling system for controlling the cooling rate of a monocrystalline ingot.

Referring to FIG. 1, a crystal pulling system is shown schematically and is indicated generally at 100. The crystal pulling system 100 is used to produce monocrystalline (i.e., single crystal) ingots of semiconductor or solar-grade material (e.g., silicon) by the Czochralski (CZ) method. The illustrated crystal pulling system 100 is configured for growing ingots in a batch or recharge CZ method, although the systems and methods disclosed herein may be used to grow monocrystalline ingots by a continuous CZ method.

The illustrated crystal pulling system 100 generally includes a housing 102 defining a growth chamber 104 and an ingot removal chamber 106 connected to and positioned above the growth chamber 104. A graphite support or susceptor 108 is supported by a rotatable shaft 110 within the growth chamber 104. A crucible 112 containing a melt 114 of semiconductor or solar-grade material (e.g., silicon) from which a monocrystalline ingot 116 is pulled by a pulling mechanism 118 is supported within the growth chamber 104 by the susceptor 108. One or more heating elements 120 are positioned proximate the crucible 112 for supplying thermal energy to the system 100. During the crystal growth process, a seed crystal 122 is lowered by the pulling mechanism 118 into contact with the melt 114 and then slowly raised from the melt 114. As the seed crystal 122 is slowly raised from the melt 114, atoms from the melt 114 align themselves with and attach to the seed crystal 122 to form the ingot 116.

The crystal pulling system 100 also includes a multi-stage cooling system 200 (broadly, a temperature control system) configured to control the cooling rate of the ingot 116 as the ingot is pulled from the melt 114. As described in more detail herein, the multi-stage cooling system 200 enables controlled cooling of the ingot 116 as the ingot 116 is removed from the melt 114, and thereby facilities reducing and/or controlling lateral incorporation and nucleation of defects within ingot 116.

The housing 102 includes a lower portion 124, an upper dome 126 connected to the lower portion 124, and an elongate tubular portion 128 extending generally upward from the upper dome 126. The growth chamber 104 is defined by the lower portion 124 and the upper dome 126, and the ingot removal chamber 106 is generally defined by the elongate tubular portion 128. The upper dome 126 includes a central annular opening 130 through which the ingot 116 is pulled into the ingot removal chamber 106. The housing 102 may be made of stainless steel or other suitable materials. In some embodiments, one or more of the lower portion 124, the upper dome 126, and the tubular portion 128 may include fluid-cooled (e.g., water-cooled) stainless steel walls.

The crucible 112 is positioned within the growth chamber 104 and beneath the removal chamber 106 such that the ingot 116 can be pulled by the crystal pulling mechanism 118 through the central opening 130 in the upper dome 126 and into the removal chamber 106. The crucible 112 may be made of, for example, quartz or any other suitable material that enables the crystal pulling system 100 to function as described herein. Further, the crucible 112 may have any suitable size that enables the crystal pulling system 100 to function as described herein. In some embodiments, the crucible has a diameter of between about 500 millimeters (mm) and about 1080 mm.

The pulling mechanism 118 generally includes a pull cable 132, a seed holder or chuck 134 connected to one end of pull cable 132, and the seed crystal 122 secured to the seed holder or chuck 134 for initiating crystal growth. The pull cable 132 is connected to a suitable lift or motor to pull the pull cable 132, along with the crystal chuck 134, the seed crystal 122, and the ingot 116, generally upward along a pull axis 136. The pulling mechanism 118 is also configured to rotate the seed crystal 122 to facilitate uniform crystal growth.

The heating elements 120 are configured to melt an initial charge of solid feedstock (such as chunk polysilicon), and maintain the melt 114 in a liquefied state after the initial charge is melted. The heating elements are arranged at suitable locations about the crucible 112. In the illustrated embodiment, one of the heating elements 120 is positioned beneath the crucible 112 and the susceptor 108, and another heating element 120 is positioned around a sidewall of the crucible 112. In the illustrated embodiment, each heating element 120 has a generally annular shape, although the heating elements 120 may have any suitable shape that enables the crystal pulling system 100 to function as described herein. In the example embodiment, the heating elements 120 are resistive heaters, although the heating elements 120 may be any suitable heating device that enables the system 100 to function as described herein. Further, while the illustrated embodiment is shown and described as including two heating elements 120, the system 100 may include any suitable number of heating elements that enables the system 100 to function as described herein.

The crystal pulling system 100 also includes a controller 138 communicatively connected to various components of the system 100, including the heating elements 120, the pulling mechanism 118, and the rotatable shaft 110 (or a motor (not shown) connected to the shaft 110). The controller 138 controls electric current supplied to the heating elements 120 to control the amount of thermal energy supplied by the heating elements 120. The controller 138 also controls operation of the pulling mechanism 118 and the rotatable shaft 110. In particular, the controller 138 is configured to control a pull rate of the pulling mechanism 118, a rotation rate of the seed crystal 122, and a rotation rate of the shaft 110.

The crystal pulling system 100 may also include one or more sensors (not shown), such as a pyrometer or like temperature sensor, to provide continuous or intermittent measurements of the temperature of the melt 114 at the melt/crystal interface of the growing single crystal ingot 116. The sensors may be communicatively connected with controller 138 to provide feedback information about the growth process to the controller.

As shown in FIG. 1, the multi-stage cooling system 200 generally includes an annular heat shield 202 mounted within the crystal pulling system housing 102, and a multi-stage heat exchanger shown in the form of a cooling jacket 204. The heat shield 202 is mounted in the growth chamber 104 above the melt 114 and radially outward from the cooling jacket 204, and defines an elongate passage 206 sized and shaped to receive the ingot 116 as the ingot is pulled up from the melt. The cooling jacket 204 is positioned radially inward from the heat shield 202, and within the elongate passage 206. The cooling jacket 204 is concentrically arranged with the heat shield 202, and defines a central passage 207 for receiving the ingot 116 as the ingot 116 is pulled by the pulling mechanism 118. The cooling jacket 204 includes a cylindrical fluid-cooled housing 208 having an upper portion 210 and a lower portion 212 spaced vertically from the upper portion 210 by an annular gap 214 defined in the housing 208. The heat shield 202 is positioned and oriented to reflect heat radiated by the ingot 116 (and other components of the crystal pulling system 100) back towards the ingot 116 through the gap 214.

Figure 2:
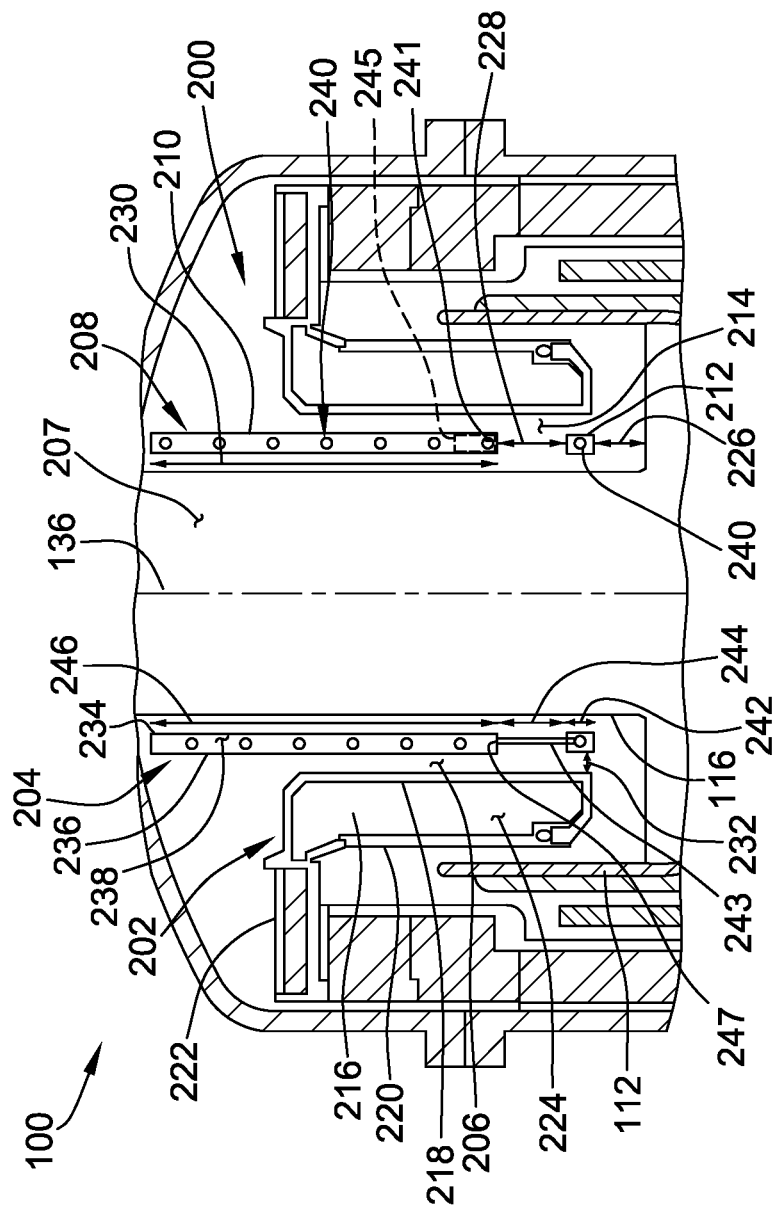
FIG. 2 is an enlarged view of a portion of the crystal pulling system of FIG. 1 illustrating details of the cooling system including a heat shield and a heat exchanger shown in the form of a cooling jacket.

With additional reference to FIG. 2, the heat shield 202 in the illustrated embodiment includes an insulating layer 216 disposed between an inner reflector 218 and an outer reflector 220 arranged co-axially with one another. The inner and outer reflectors 218, 220 are each substantially cylindrical in the example embodiment, although the reflectors may have other shapes, such as conical. The heat shield 202 extends downward from an annular support 222, and extends down into the crucible 112 to a position above the melt surface so that the outer reflector 220 is at least partially interposed between the crucible side wall and the growing ingot 116.

The inner reflector 218 and the outer reflector 220 are constructed of suitable heat reflective materials. Suitable materials from which the inner reflector 218 and the outer reflector 220 may be constructed include, for example and without limitation, graphite, silicon carbide coated graphite, and high purity molybdenum. The inner reflector 218 may be constructed of the same material as the outer reflector 220, or the inner and outer reflectors 218, 220 may be constructed of different materials.

The insulating layer 216 is constructed of a material having low thermal conductivity, and is contained within an insulation chamber 224 defined between the inner reflector 218 and the outer reflector 220 to insulate the inner reflector 218 against heat transfer from the outer reflector 220 to the inner reflector 218.

The multi-stage cooling jacket 204 is mounted on the crystal puller housing 102 adjacent the bottom of the removal chamber 106 and extends down into the growth chamber 104 and into the elongate passage 206 defined by the heat shield 202. As noted above, the cooling jacket 204 includes a cylindrical fluid-cooled housing 208 having a top or upper portion 210 spaced vertically from a bottom or lower portion 212 by an annular gap 214 defined by the housing 208. As described in more detail herein, the gap 214 between the upper portion 210 and the lower portion 212 reduces the cooling rate (i.e., decreases the rate of cooling) of the ingot 116 as the ingot 116 is pulled through the cooling system 200, thereby providing multiple different cooling zones arranged vertically along the pull axis 136.

The lower portion 212 of the housing 208 is spaced a sufficient distance 226 from the melt 114 to enable a flow of purge gas between the melt 114 and the lower portion 212 of the housing without creating surface disruptions in the surface of the melt 114. In some embodiments, the distance 226 between the lower portion 212 of the housing 208 and the melt 114 may be minimal to enable rapid cooling of the ingot 116 as it is pulled from the melt 114. In some embodiments, the distance 226 between the lower portion 212 of the housing 208 and the melt 114 is in the range of about 30 mm to about 70 mm.

The upper and lower portions 210, 212 of the cooling jacket housing 208 may be connected to one another by one or more bridges or interconnecting members (not shown) extending from the upper portion 210 to the lower portion 212. The size of the gap 214 (i.e., the vertical spacing or length 228 between the upper portion 210 and the lower portion 212) is selected based on, among other things, the size of the ingot 116, the temperature profile within the growth chamber 104, and the pull rate of the ingot 116. The gap 214 is sized to provide a zone of reduced cooling over a temperature range between the solidification temperature of the ingot 116 and a nucleation temperature of defects incorporated into the ingot. The gap is sized to provide sufficient time for diffusion of vacancies or other impurities incorporated into the ingot 116, thereby allowing incorporated defects to be more evenly distributed and reducing localized high concentration regions of defects, such as near the lateral surface of the ingot 116. In some embodiments, the gap 214 has a size (i.e., vertical length 228) of between about 50 mm and about 200 mm.

Other dimensions of the cooling jacket 204 and the cooling system 200 may also be based on the size of the ingot 116, the temperature profile within the growth chamber 104, and/or the pull rate of the ingot 116. In some embodiments, the vertical length 230 of the upper portion 210 of the housing 208 is between about 250 mm and about 500 mm. Further, in some embodiments, the cooling jacket 204 is spaced from the heat shield 202 by a radial distance or spacing 232 of between about 0 mm and about 200 mm.

Figure 3:
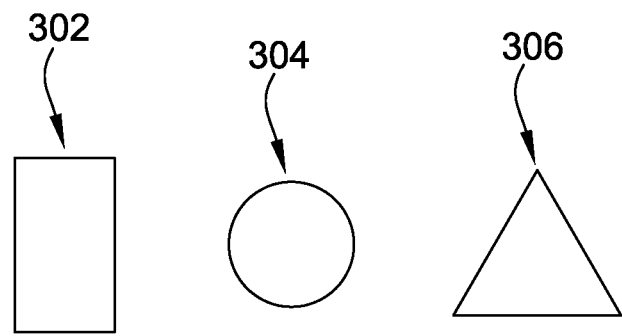
FIG. 3 illustrates different cross-sectional shapes suitable for a lower portion of the housing of the heat exchanger shown in FIGS. 1 and 2.

In the illustrated embodiment, the lower portion 212 of the housing 208 has a square cross-section, and the upper portion 210 of the housing 208 has a rectangular cross-section. In other suitable embodiments, the housing 208, including the upper portion 210 and the lower portion 212, may have any suitable cross-sectional shape that enables the cooling jacket 204 to function as described herein. Referring to FIG. 3, for example, the lower portion 212 of the housing 208 may have a rectangular cross section 302, a rounded or circular cross-section 304, or a triangular cross-section 306. In some embodiments, the lower portion 212 is shaped to provide directional heat reflectivity relative to the growing ingot 116. For example, a lower portion having a rounded or triangular cross-section may be used to deflect heat radiated from the ingot away from an axial segment of the ingot being pulled through the lower portion 212 of housing 208, and towards an axial segment of the ingot positioned vertically between the upper and lower portions 210, 212 of the housing 208.

Referring again to FIG. 2, the housing 208 also includes an inner panel 234 and an outer panel 236 spaced radially outward from the inner panel and arranged relative to each other to define an interior chamber 238, as shown in FIG. 2. A cooling tube 240 is disposed in the interior chamber 238 and has a helical coil construction, with turns of the cooling tube circumscribing the inner panel 234 of the housing in close contact relationship therewith. The cooling tube 240 is sized relative to the jacket housing 208 such that the turns of the cooling tube 240 are also in close contact relationship with the outer panel 236 of the housing.

The cooling tube 240 is fluidly connected to a suitable cooling fluid source, such as water, via a conduit (not shown) to receive cooling fluid into the cooling jacket 204. The interior chamber 238 of the cooling jacket housing 208 is fluidly connected to an outlet or exhaust port (not shown) via a conduit (not shown) to exhaust cooling fluid from the cooling jacket 204.

As shown in FIG. 2, the turns of the cooling tube 240 wind downward within the interior chamber 238 of the cooling jacket housing 208 to direct cooling fluid down through the cooling tube 240. In some embodiments, the lowermost turn of the cooling tube 240 may include an opening 241 so that cooling fluid is exhausted from the cooling tube 240 into the interior chamber 238 of the cooling jacket housing 208, and directed downward into the lower portion 212 of the housing 208 via one or more interconnecting members 243 interconnecting the upper portion 210 to the lower portion 212. In other embodiments, the cooling tube 240 may extend downward into the lower portion of the housing 208, and direct cooling fluid directly into the lower portion 212 of the cooling jacket housing 208.

The cooling jacket 204 may also include one or more baffles 245 within the interior chamber 238 to direct cooling fluid exhausted from the cooling tube 240 to desired portions of the cooling jacket 204, such as the lower portion 212 of the cooling jacket housing 208, or towards an outlet port 247 of the cooling jacket housing 208.

In the example embodiment, the cooling jacket 204, including the housing 208 and the cooling tube 240, are constructed of steel, although the cooling jacket 204 may be constructed from materials other than steel. Further, the cooling tube 240 may have a construction other than a helical coil construction, such as by being formed as an annular ring (not shown) or other plenum structure (not shown) that circumscribes all or part of the inner panel 234 of the cooling jacket housing 208.

In operation of the cooling jacket 204, cooling fluid is received into the cooling jacket 204 from the cooling fluid source via a suitable conduit (not shown), and flows downward through the cooling tube 240 within the interior chamber 238 of the cooling jacket housing 208. With the cooling tube 240 in close contact relationship with the inner panel 234 of the housing 208, conductive heat transfer occurs between the inner panel 234 and the cooling fluid in the cooling tube 240 to cool the inner panel 234. When cooling fluid reaches the lowermost turn of the cooling tube 240, it flows out of the cooling tube 240 and is directed downward into the lower portion 212 of the housing 208. The cooling fluid then flows around the lower portion 212 of the housing 208, and back upward beneath the lowermost turn of the cooling tube 240 in a direction opposite the direction that cooling fluid flows downward through the cooling tube. As a result, cooling fluid flows back up through the interior chamber 238 of the housing 208 generally within the spacing between the turns of the cooling tube 240. Cooling fluid flows out from the housing 208 via an exhaust or outlet port (not shown).

The configuration of the cooling system 200, and more particularly, the cooling jacket 204, results in a plurality of different cooling zones being defined vertically along the pull axis 136 of the crystal pulling system 100. In the illustrated embodiment, the cooling system 200 (specifically, the cooling jacket 204) defines a first cooling zone 242 along the lower portion 212 of the housing 208, a second cooling zone 244 between the lower portion 212 and upper portion 210 of the housing 208 (i.e., coextensive with the gap 214), and a third cooling zone 246 along the upper portion 210 of the housing 208. The first cooling zone 242 has an enhanced or relatively high cooling rate, and may be used to "quench" or rapidly cool the ingot 116 (or an axial segment thereof) to a temperature below a solidification temperature of the ingot 116, such as about 1100° C. for silicon. Suitable cooling rates for the first cooling zone include, for example and without limitation, cooling rates in the range of about 2° C./minute to about 4° C./minute. The second cooling zone 244 has a reduced or relatively low cooling rate, and may be used to slowly cool the ingot 116 (or an axial segment thereof) from a temperature below the solidification temperature of the ingot 116 (e.g., 1100° C.) down to a nucleation temperature (e.g., 900° C.) of defects incorporated into the ingot 116. Suitable cooling rates for the second cooling zone include, for example and without limitation, cooling rates in the range of about 0.5° C./minute to about 1.5° C./minute. The third cooling zone 246 has an enhanced or relatively high cooling rate, and may be used to rapidly cool the ingot 116 (or an axial segment thereof) from a temperature at or near a defect nucleation temperature (e.g., 900° C.) to a temperature below the defect nucleation temperature (e.g., 600° C.). Suitable cooling rates for the third cooling zone include, for example and without limitation, cooling rates in the range of about 1.5° C./minute to about 2.5° C./minute. The first and third cooling zones 242, 246 are interchangeably referred to herein as enhanced-rate cooling zones due the enhanced cooling effect of the cooling jacket 204. The second cooling zone 244 is interchangeably referred to herein as a reduced-rate cooling zone due to the reduced or diminished cooling rate of the ingot 116 resulting from heat being reflected by the heat shield 202 back towards the ingot 116 through the gap 214 within the second cooling zone, as described in more detail herein.

Figure 4:
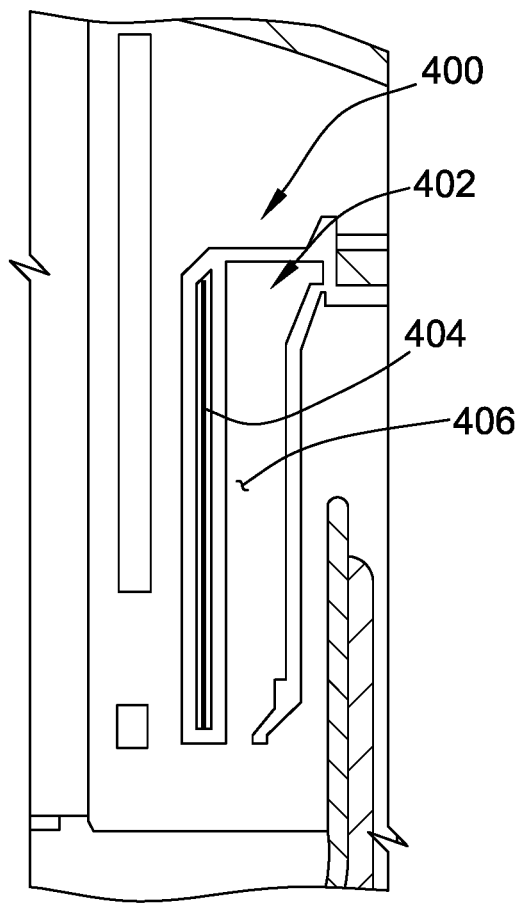
FIG. 4 is a partial cross-section of another embodiment a cooling system suitable for use in the crystal pulling system of FIG. 1.
Figure 5:
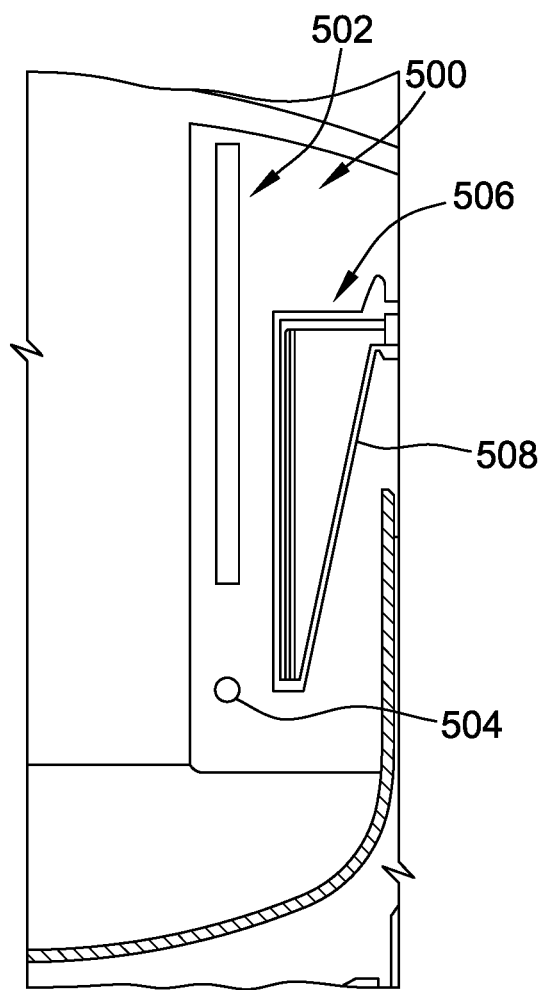
FIG. 5 is a partial cross-section of another embodiment a cooling system suitable for use in the crystal pulling system of FIG. 1.
Figure 6:
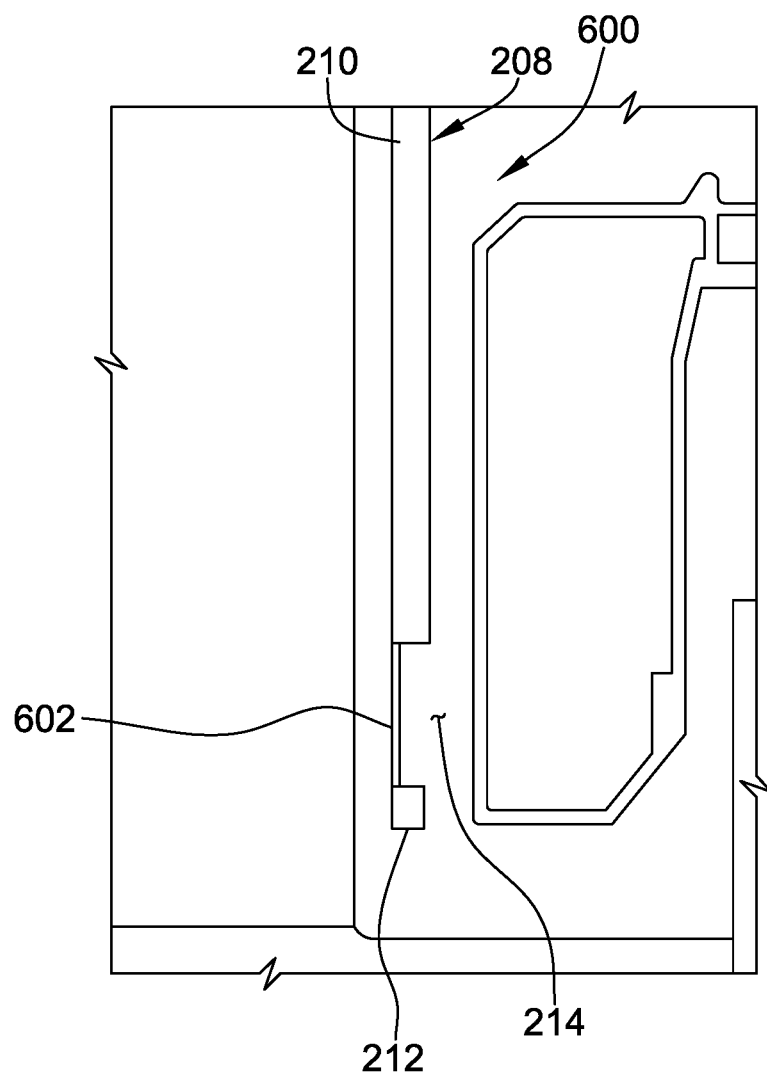
FIG. 6 is a partial cross-section of another embodiment a cooling system suitable for use in the crystal pulling system of FIG. 1.

The configuration of the cooling system 200, such as the heat shield 202 and the cooling jacket 204, may vary without departing from some aspects of this disclosure. FIGS. 4-6, for example, illustrate different embodiments of cooling systems suitable for use with the crystal pulling system 100 of FIGS. 1 and 2.

FIG. 4 is a partial view of another embodiment of a cooling system 400 suitable for use in the crystal pulling system 100 shown in FIGS. 1 and 2. In the embodiment illustrated in FIG. 4, the cooling system 400 is substantially identical to the cooling system 200 of FIGS. 1 and 2, except the cooling system 400 includes a heat shield 402 having a radiation shield 404 and a gap 406 filled with inert gas enclosed within the heat shield 402 instead of insulating material.

FIG. 5 is a partial view of another embodiment of a cooling system 500 suitable for use in the crystal pulling system 100 shown in FIGS. 1 and 2. In the embodiment illustrated in FIG. 5, the cooling system 500 is substantially identical to the cooling system 200 of FIGS. 1 and 2, except the cooling system 500 includes a cooling jacket 502 with a housing lower portion 504 having a circular cross section, and a heat shield 506 having a conical outer reflector 508.

FIG. 6 is a partial view of another embodiment of a cooling system 600 suitable for use in the crystal pulling system 100 shown in FIGS. 1 and 2. In the embodiment illustrated in FIG. 6, the cooling system 600 is substantially identical to the cooling system 200 of FIGS. 1 and 2, except the cooling system 600 includes a quartz baffle 602 disposed proximate the gap 214 defined by the housing 208 between the upper portion 210 and the lower portion 212. The quartz baffle 602 extends the length of the gap 214, and is connected to the housing 208 at the upper portion 210 and at the lower portion 212. The quartz baffle 602 is configured to inhibit gas flow through the gap 214, and to maintain a consistent gas flow pattern near the melt surface. The quartz baffle 602 thereby facilitates preventing deposition of oxide deposits, which may result in a higher incidence of crystal structure loss.

In the above-described cooling systems, the components of the cooling systems are arranged to provide generally the same thermal or cooling cycle of the ingot as the ingot is pulled from the melt. The particular arrangement of the components may vary based on practical implementation considerations, including ease of assembly, cost of components, and lifetime of components due to aging, cracking, damage, etc. In general, components having a thinner radial span will have a lower overall radial temperature gradient, and, consequently, less thermal stress.

Without being bound by any particular theory, it is believed that the arrangement of multiple different cooling zones of the cooling systems described herein facilitates reducing the size and concentration of defects grown in to the defect edge band of the ingot 116. In particular, it is believed that by initially rapidly cooling or quenching the ingot to solidify the ingot near the melt, the concentration of vacancies initially incorporated into the ingot at the initial stage of crystal growth will be reduced. Because the lateral incorporation of vacancies and other defects establishes the initial excess defect concentration near the edge of the crystal being grown in a CZ process, fewer defects are available to agglomerate to form large defects. Further, by slowly cooling the ingot from the solidification temperature to a temperature at or around a defect nucleation temperature, it is believed that vacancies and other defects incorporated into the ingot near the lateral edge will diffuse radially inward, thereby allowing incorporated defects to be more evenly distributed and reducing localized high concentration regions of defects near the lateral surface of the ingot. Further, it is believed that rapidly cooling the ingot through defect nucleation temperatures inhibits or "freezes" the growth of voids and oxygen precipitates, thereby reducing the average size of agglomerated defects in the grown-in edge band of the ingot.

Referring again to FIGS. 1 and 2, in use, the crystal pulling system 100 is used to grow monocrystalline ingots from the melt 114 according to the Czochralski method. More specifically, the melt 114 is prepared in the crucible 112 by charging the crucible 112 with feedstock material, such as chunk polycrystalline silicon. The feedstock material is melted in the crucible 112 using heating elements 120 to form the melt 114 of semiconductor or solar grade material. Once the feedstock material is sufficiently melted, the seed crystal 122 is lowered into contact with the melt 114 by the pulling mechanism 118 to initiate crystal growth, and a monocrystalline ingot is grown from the melt 114 by subsequently pulling the seed crystal 122 away from the melt. The ingot 116 is pulled through the elongate passage 206 defined by the heat shield 202, and through the passage 207 defined by the housing 208 of the multi-stage cooling jacket 204.

As the ingot 116 is pulled through the multi-stage cooling system 200, the ingot 116 is cooled at different cooling rates. More specifically, an axial segment of the ingot is cooled at at least three different cooling rates as the axial segment is pulled through the cooling system 200. In particular, the axial segment is cooled at a first, initial cooling rate as the ingot 116 is pulled through the lower portion 212 of the housing 208 and the first cooling zone 242. The initial cooling rate is a relatively high cooling rate and "quenches" or rapidly solidifies the ingot 116 to reduce vacancy incorporation and concentration at the initial stages of crystal growth.

The axial segment is cooled at a second cooling rate less than the first cooling rate as the ingot 116 is pulled past the lower portion 212 of the housing 208 and through the second cooling zone 244 adjacent the gap 214. When the axial segment is positioned within the second cooling zone 244, heat radiated by the ingot 116 (and other portions of the crystal pulling system 100) is reflected back towards the ingot 116 through the gap 214 by the heat shield 202. The reflected heat causes the ingot (specifically, the axial segment within the second cooling zone 244) to cool more slowly than in the first cooling zone 242 and the third cooling zone 246. The reduced cooling rate facilities diffusion of vacancies and/or other impurities incorporated into the ingot, thereby allowing incorporated defects to be more evenly distributed and reducing localized high concentration regions of defects, such as near the lateral surface of the ingot.

As the axial segment of the ingot 116 is pulled past the second cooling zone 244 and into the upper portion 210 of the housing 208 and the third cooling zone 246, the axial segment is cooled at a third cooling rate greater than the second cooling rate. The third cooling rate is a relatively high cooling rate and facilities reducing or inhibiting growth of agglomerated defects below the associated defect nucleation temperature by limiting the thermal energy available for diffusion and nucleation.

In one embodiment, the method of growing a monocrystalline ingot may further include controlling one or more process parameters of the growth process to control the profile of the melt/crystal interface of the ingot based on a desired or target melt/crystal interface profile. In particular, use of the multi-stage cooling systems described herein results in a hot zone configuration (i.e. the heater, insulation, heat shield(s), cooling jacket, and radiation shield(s), among other things) different than hot zone configurations in previously used crystal pulling systems. As a result, the thermal profile within the growth chamber is different, which impacts the thermal gradient in the core of the ingot as well as the profile of the melt/crystal interface. Because the profile of the melt/crystal interface affects lateral incorporation of vacancies during crystal growth, a new target melt/crystal interface profile may be determined based on the new hot zone configuration in order to further reduce or minimize the size and/or concentration of defects grown into the defect edge band.

Figure 7:
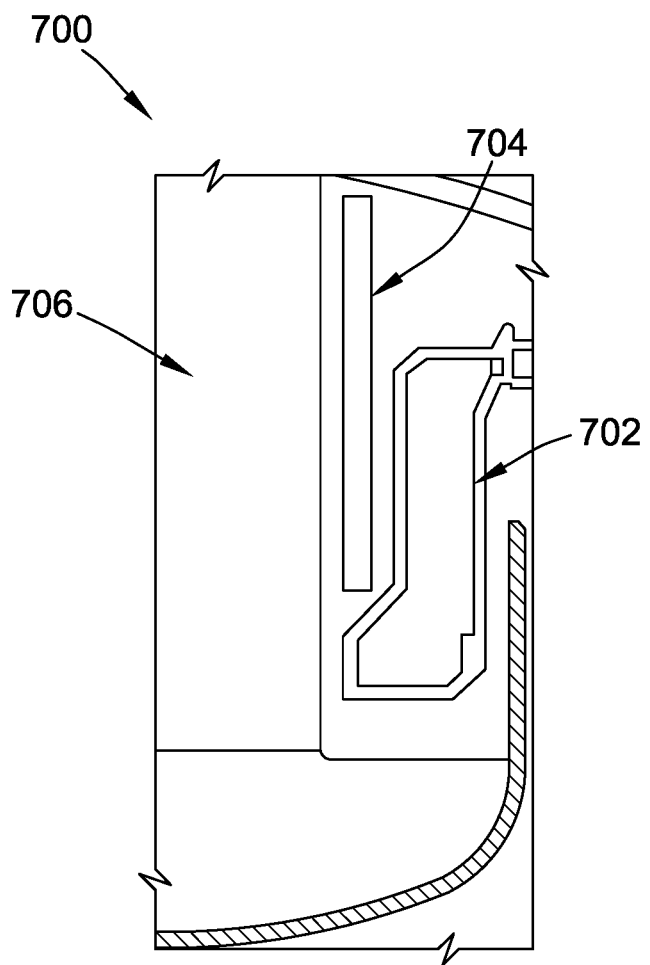
FIG. 7 is a partial cross-section of a previous crystal pulling system including a single-stage cooling jacket.
Figure 8:
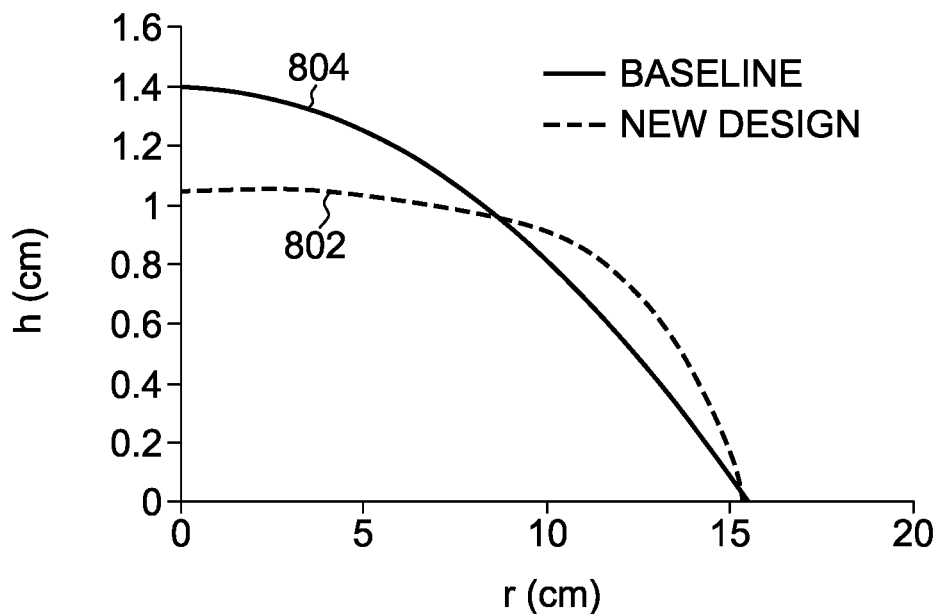
FIG. 8 is a plot illustrating simulated melt/crystal interface profiles for crystal ingots grown using the crystal pulling systems of FIGS. 1 and 7.
Figure 9:
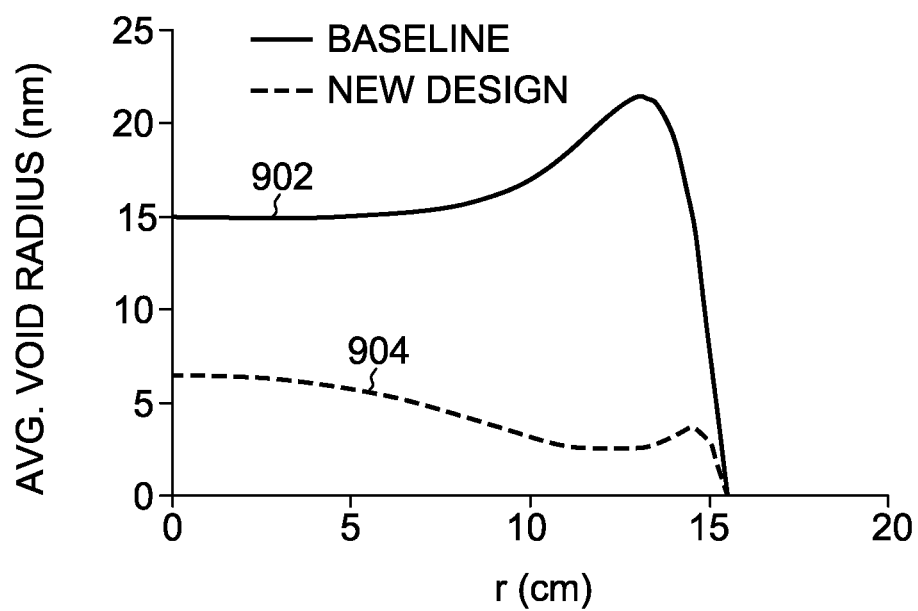
FIG. 9 is a plot illustrating simulated radial profiles of average void radius for crystal ingots grown using the crystal pulling systems of FIGS. 1 and 7.
Figure 10:
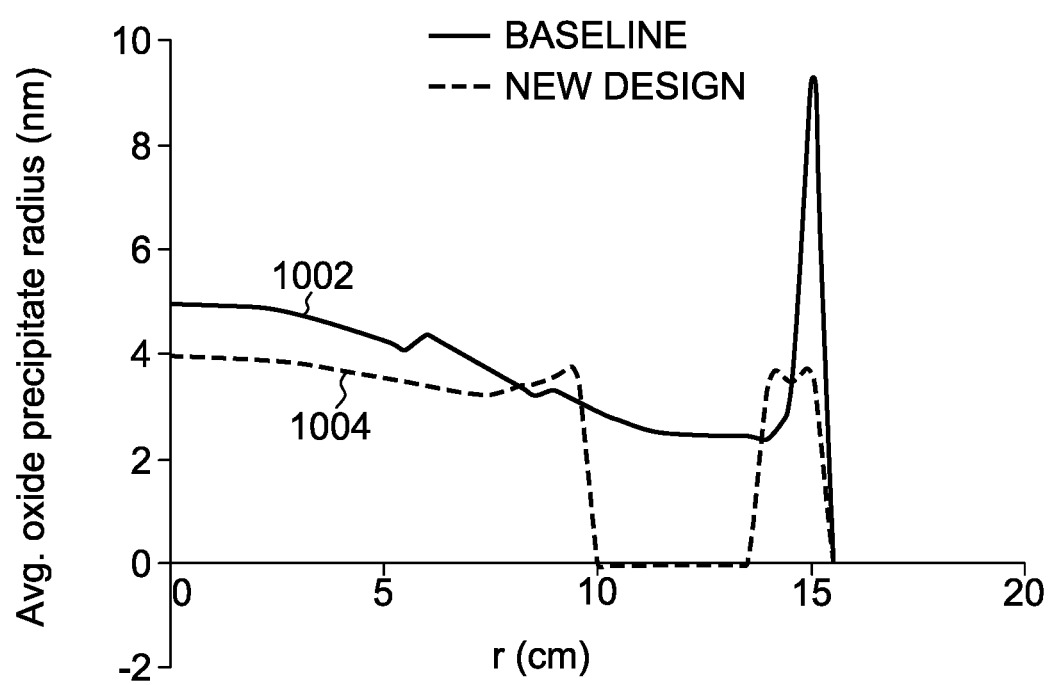
FIG. 10 is a plot illustrating simulated radial profiles of average oxide precipitate radius for crystal ingots grown using the crystal pulling systems of FIGS. 1 and 7.

FIG. 7 is a partial view of a previous crystal pulling system 700 including a heat shield 702 and a single-stage cooling jacket 704. FIG. 8 is a plot illustrating a simulated radial profile 802 of a melt/crystal interface for an ingot 706 grown in the crystal pulling system 700 of FIG. 7 versus a height in centimeters ("h cm") of the ingot 706 from the surface of the melt, along with a new target radial profile 804 of a melt/crystal interface for an ingot grown in the crystal pulling system 100 of FIGS. 1 and 2. FIG. 9 is a plot illustrating the simulated radial profile 902 of the average void radius for a crystal ingot grown in the crystal pulling system 700 of FIG. 7 according to the melt/crystal interface profile 802 shown in FIG. 8. FIG. 9 also illustrates the simulated radial profile 904 of the average void radius for a crystal ingot grown in the crystal pulling system 100 of FIGS. 1 and 2 according to the melt/crystal interface profile 804 shown in FIG. 8. FIG. 10 is a plot illustrating the simulated radial profile 1002 of the average oxide precipitate radius for a crystal ingot grown in the crystal pulling system 700 of FIG. 7 according to the melt/crystal interface profile 802 shown in FIG. 8. FIG. 10 also illustrates the simulated radial profile 1004 of the average oxide precipitate radius for a crystal ingot grown in the crystal pulling system 100 of FIGS. 1 and 2 according to the melt/crystal interface profile 804 shown in FIG. 8.

As shown in FIGS. 9 and 10, the ingot growth simulations based on the crystal pulling system 100 of FIGS. 1 and 2 using the target melt/crystal interface profile 804 had significantly lower simulated average void and oxide precipitate sizes, and the simulated radial defect size profiles did not have significant peaks, as did the simulated defect size profiles for the ingot growth simulation based on the crystal pulling system 700 of FIG. 7. In particular, the average size of voids in the center region of the ingot (i.e., up to 7.5 cm from center for a 300 mm ingot) was reduced by 60% as compared to the ingot grown using the previous crystal pulling system. The average size of voids in the edge region (i.e., about 2.5 cm from the edge of the ingot) was reduced by about 75% as compared to the ingot grown using the previous crystal pulling system. The average size of oxide precipitates was reduced by about 33% in the center region of the ingot and by about 50% in the edge region as compared to the ingot grown using the previous crystal pulling system.

The target melt/crystal interface profile for an ingot may be determined, for example, based on the hot zone configuration of the crystal pulling system, as well as a desired defect concentration profile and/or an average defect size profile. Because the hot zone configuration also affects the defect concentration profile and the average defect size profile of grown ingots, an iterative approach may be used to arrive at a desired or optimal hot zone configuration and a target melt/crystal interface profile.

Once the target melt/crystal interface profile is determined, one or more process parameters of the growth process may be controlled based on the target melt/crystal interface profile. Referring to FIGS. 1 and 2, for example, the process parameters that may be controlled during the crystal growth process may include, for example and without limitation, the rotation rate of the seed crystal 122, the rotation rate of the crucible 112, the pull rate of the ingot 116, and the power supplied to heat heating element 120. In one embodiment, the rotation rate of the seed crystal 122 is controlled based on the determined target melt/crystal interface profile. For example, the controller 138 may be programmed to control the rotation rate of the seed crystal 122 based on an input target melt/crystal interface profile.

Embodiments of the crystal pulling systems described herein may also include one or more gas flow guides or barriers to control and/or inhibit the flow of gas within certain portions of the crystal pulling system. In some embodiments, for example, the crystal pulling system 100 may include a gas flow barrier to prevent or inhibit the flow of oxide species evaporated from the melt (e.g., SiO and SiO$_2$) to areas around the cooling jacket 204, such as between the cooling jacket 204 and the heat shield 202. Such gas flow barriers may improve the Czochralski growth process by reducing the rate of particulate deposition on the cooling jacket 204 and, consequently, reducing the likelihood of particulate shedding and loss of CZ crystal structure. In particular, because the surfaces of the cooling jacket 204 are relatively cool as compared to other surfaces within the hot zone, gases evaporated from the melt during the crystal growth process, such as silicon oxide species (i.e., SiO$_x$ species), tend to deposit more quickly on the cooling jacket as compared to other portions of the crystal pulling system 100. As the thickness of these deposits increase, the likelihood of particulate shedding and loss of CZ crystal structure also increases. Embodiments of gas flow barriers described herein may improve the Czochralski crystal growth process by reducing the rate of particulate deposition on the cooling jacket and, consequently, reducing the likelihood of particulate shedding and loss of CZ crystal structure.

Figure 11:
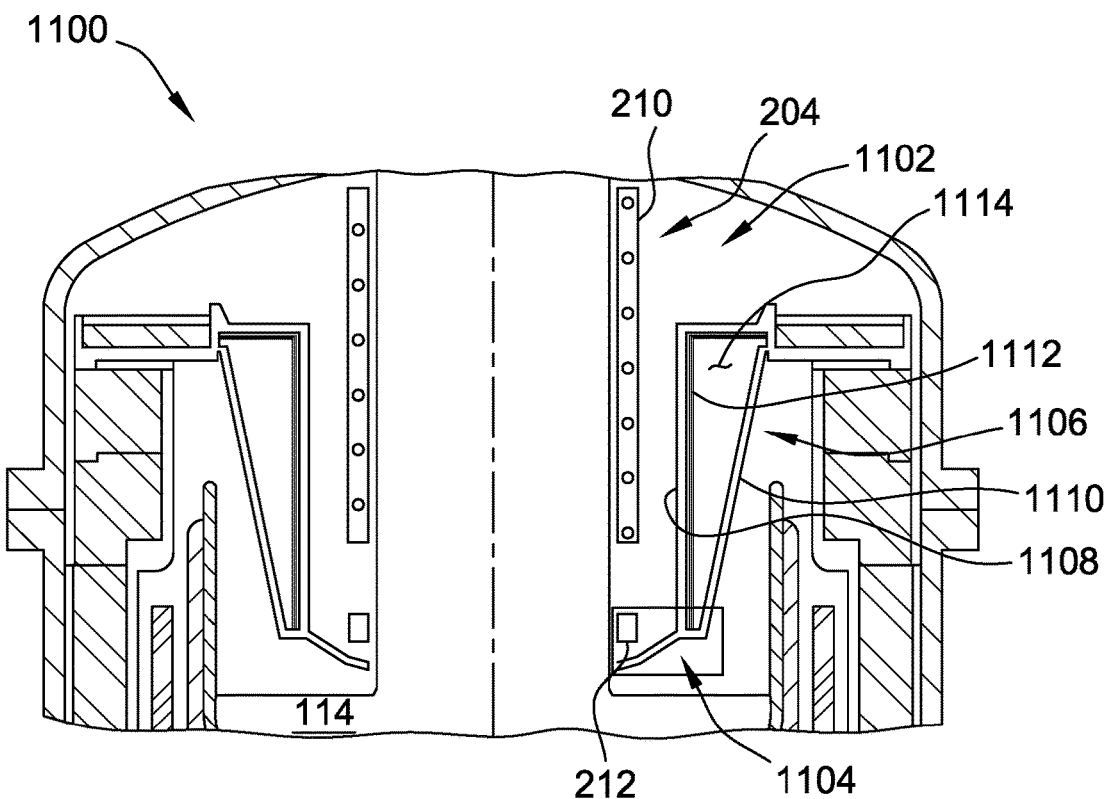
FIG. 11 is a schematic cross-section of another crystal pulling system that includes a cooling system having a gas flow barrier.

FIG. 11 is a schematic cross-section of a crystal pulling system 1100 that includes a multi-stage cooling system 1102 and a gas flow barrier 1104. The multi-stage cooling system 1102 includes a heat shield 1106 similar to the heat shield 506 shown and described above with reference to FIG. 5, and the cooling jacket 204 (interchangeably referred to as a multi-stage heat exchanger) shown and described above with reference to FIGS. 1 and 2. The crystal pulling system 1100 is otherwise substantially identical to the crystal pulling system 100 shown and described above with reference to FIGS. 1 and 2. Components of the crystal pulling system 1100 that are the same as the components of the crystal pulling system 100 are identified with like reference numerals.

As shown in FIG. 11, the heat shield 1106 includes an inner reflector 1108 and an outer reflector 1110. The inner reflector 1108 is oriented substantially vertically, and has a generally cylindrical shape. The outer reflector 1110 is oriented at an oblique angle relative to the inner reflector 1108, and has a generally conical shape. The heat shield 1106 also includes a radiation shield 1112 disposed within a volume 1114 enclosed by the inner reflector 1108 and the outer reflector 1110. Suitable materials from which the inner reflector 1108 and the outer reflector 1110 may be constructed include, for example and without limitation, graphite, silicon carbide coated graphite, and high purity molybdenum. The inner reflector 1108 may be constructed of the same material as the outer reflector 1110, or the inner and outer reflectors 1108 and 1110 may be constructed of different materials. In one embodiment, the inner reflector 1108 and the outer reflector 1110 are constructed from graphite, and the radiation shield 1112 is constructed from a plurality of molybdenum sheets.

Figure 12:
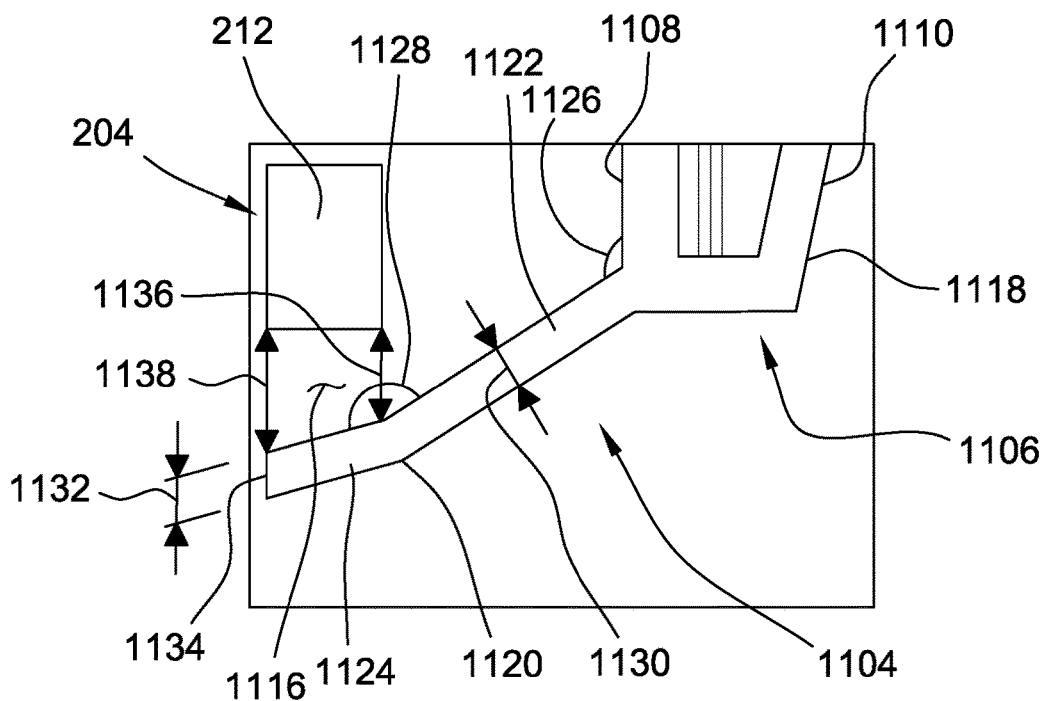
FIG. 12 is an enlarged view of a portion of the crystal pulling system of FIG. 11 illustrating details of the gas flow barrier.

FIG. 12 is an enlarged view of a portion of the crystal pulling system 1100 shown in FIG. 11 illustrating details of the gas flow barrier 1104. As shown in FIG. 12, the gas flow barrier 1104 extends under the multi-stage heat exchanger or cooling jacket 204 (specifically, under the lower portion 212 of the cooling jacket 204) such that an annular opening 1116 is defined between the gas flow barrier 1104 and the cooling jacket 204 (specifically, the lower portion 212 of the cooling jacket 204). In the example embodiment, the gas flow barrier 1104 is connected to a lower end 1118 of the heat shield 1106 (specifically, the inner reflector 1108), and extends radially inward from the heat shield 1106 and under the cooling jacket 204 to define the annular opening 1116. The gas flow barrier 1104 extends continuously (i.e., without interruptions, spaces, gaps, or holes) from the heat shield 1106 to beneath the cooling jacket 204 such that gas flow upward between the heat shield 1106 and the radial outer surface of the cooling jacket 204 is substantially inhibited.

Further, in the example embodiment, the gas flow barrier 1104 extends between the lower portion 212 of the cooling jacket 204 and the melt 114 (shown in FIG. 11) so as to prevent direct line-of-sight between the melt 114 and the lower portion 212 of the cooling jacket 204. In other words, the gas flow barrier 1104 occludes the lower portion 212 of the cooling jacket 204 from direct vertical line-of-sight with the melt 114. The gas flow barrier 1104 thereby reduces heat losses from the melt 114 by limiting heat transfer between the cooling jacket 204 and the melt 114, and thereby reduces the amount of heater power needed to carry out the Czochralski growth process. In some embodiments, for example, use of the gas flow barrier 1104 may reduce the power required to power the heater by about 5 kilowatt-hours. Moreover, the position of the gas flow barrier 1104 facilitates shielding the cooling jacket 204 from melt splashes that may occur during feeding of granular feedstock material (e.g., polysilicon) into the melt 114.

In the example embodiment, the gas flow barrier 1104 includes a plate 1120 having a general frusto-conical or frusto-spherical shape. In other embodiments, the gas flow barrier 1104 may have any suitable construction and shape that enables the gas flow barrier 1104 to function as described herein. In some embodiments, the gas flow barrier 1104 is formed integrally with the heat shield 1106. That is, the gas flow barrier 1104 is formed as a single, unitary piece with the heat shield 1106. In other embodiments, the gas flow barrier 1104 is formed separately and connected to the heat shield 1106 with suitable fastening means (e.g., adhesives or mechanical fasteners). Suitable materials from which the gas flow barrier 1104 may be constructed include, for example and without limitation, graphite, silicon carbide coated graphite, and high purity molybdenum.

In the example embodiment, the gas flow barrier 1104 includes a first, radial outer portion 1122 and a second, radial inner portion 1124. Each of the radial outer portion 1122 and the radial inner portion 1124 is substantially planar. The radial outer portion 1122 extends radially inward and downward from the heat shield 1106 at a first oblique angle 1126, and the radial inner portion 1124 extends radially inward form the radial outer portion 1122 at a second oblique angle 1128.

The radial outer portion 1122 and the radial inner portion 1124 may have any suitable thicknesses that enable the gas flow barrier 1104 to function as described herein. In the example embodiment, the radial outer portion 1122 has a substantially uniform thickness 1130, and the radial inner portion 1124 has a thickness 1132 that continuously decreases towards a radial inner end 1134 of the gas flow barrier 1104. In some embodiments, the thickness 1130 of the radial outer portion 1122 is between 4 mm and 12 mm, such as between 4 mm and 8 mm, between 5 mm and 9 mm, between 6 mm and 10 mm, between 7 mm and 11 mm, or between 8 mm and 12 mm. In some embodiments, the thickness 1132 of the radial inner portion 1124 at the radial inner end 1134 is between 2 mm and 10 mm, such as between 2 mm and 6 mm, between 3 mm and 7 mm, between 4 mm and 8 mm, between 5 mm and 9 mm, or between 6 mm and 10 mm.

In the example embodiment, the size or height of the opening 1116 defined by the gas flow barrier 1104 and the cooling jacket 204 gradually and continuously decreases along the direction of gas flow (i.e., in the radial outward direction). In other words, the size or height 1136 of the opening 1116 at the radial outer side of the cooling jacket 204 is smaller than the size or height 1138 of the opening 1116 at the radial inner side of the cooling jacket. In some embodiments, the height 1136 of the opening 1116 at the radial outer side of the cooling jacket 204 is between 5 mm and 13 mm, such as between about 5 mm and 9 mm, between 6 mm and 10 mm, between 7 mm and 11 mm, between 8 mm and 12 mm, or between 9 mm and 13 mm. In some embodiments, the height 1138 of the opening 1116 at the radial inner side of the cooling jacket 204 is between 9 mm and 17 mm, such as between 9 mm and 13 mm, between 10 mm and 14 mm, between 11 mm and 15 mm, between 12 mm and 16 mm, or between 13 mm and 17 mm.

FIGS. 13-27 are schematic cross sections of three different crystal pulling systems illustrating computer-simulated SiO gas concentration contour plots and gas flow streamlines and flow velocity contours in the crystal pulling systems at various stages of the crystal growth process. In each figure, the computer-simulated SiO gas concentration contour plot is overlaid on the left half of each crystal pulling system, and the computer-simulated gas flow streamlines and velocity contours are overlaid on the right half of each crystal pulling system. FIGS. 13, 16, 19, 22, and 25 show the simulated gas contour plots and gas flow velocities in the previous crystal pulling system 700 shown and described above with reference to FIG. 7, FIGS. 14, 17, 20, 23, and 26 show the simulated gas contour plots and gas flow velocities in a crystal pulling system 1200 substantially identical to the crystal pulling system 1100, except without the gas flow barrier 1104, and FIGS. 15, 18, 21, 24, and 27 show the simulated gas contour plots and gas flow velocities in the crystal pulling system 1100.

FIGS. 13-15 show the crystal pulling systems 700, 1200, and 1100 during a melt stabilization stage of the crystal growing process. FIG. 13 shows the SiO gas concentrations and gas flow velocities in the crystal pulling system 700 at a first gas flow rate, and a first gas pressure. FIGS. 14 and 15 show the SiO gas concentrations and gas flow velocities in the crystal pulling system 1200 and the crystal pulling system 1100, respectively, at a second gas flow rate greater than the first gas flow rate, and a second gas pressure less than the first gas pressure. The first gas flow rate is between about 90-110 standard liters per minute (slpm), the first gas pressure is between about 30-50 Torr, the second gas flow rate is between about 180-200 slpm, and the second gas pressure is between about 10-20 Torr.

FIGS. 16-18 show the crystal pulling systems 700, 1200, and 1100 during an initial neck stage of the crystal growing process. FIG. 16 shows the SiO gas concentrations and gas flow velocities in the crystal pulling system 700 at the first gas flow rate and the first gas pressure. FIGS. 17 and 18 show the SiO gas concentrations and gas flow velocities in the crystal pulling system 1200 and the crystal pulling system 1100, respectively, at a third gas flow rate greater than the first flow rate and less than the second gas flow rate, and a third gas pressure less than the first gas pressure. The third gas flow rate is between about 140-160 slpm, and the third gas pressure is between about 10-20 Torr.

FIGS. 19-21 show the crystal pulling systems 700, 1200, and 1100 at the end of the neck stage of the crystal growing process. FIG. 19 shows the SiO gas concentrations and gas flow velocities in the crystal pulling system 700 at the first gas flow rate and the first gas pressure. FIGS. 20 and 21 show the SiO gas concentrations and gas flow velocities in the crystal pulling system 1200 and the crystal pulling system 1100, respectively, at the third gas flow rate and the third gas pressure.

FIGS. 22-24 show the crystal pulling systems 700, 1200, and 1100 at the end of a crown stage of the crystal growing process. Further, FIGS. 22-24 show the SiO gas concentrations and gas flow velocities in the respective crystal pulling systems 700, 1200, and 1100 at the same gas flow rate and the same gas pressure (specifically, the first gas flow rate and the first gas pressure).

FIGS. 25-27 show the crystal pulling systems 700, 1200, and 1100 at a stage of the crystal growing process at which the body of the crystal has a length of about 100 mm. Further, FIGS. 25-27 show the SiO gas concentrations and gas flow velocities in the respective crystal pulling systems 700, 1200, and 1100 at the same gas flow rate and the same gas pressure (specifically, the first gas flow rate and the first gas pressure).

As shown in FIGS. 14, 17, 20, 23, and 26, use of the multi-stage cooling system without a gas flow barrier results in increased gas flow upwards between the heat shield and the cooling jacket and a higher SiO gas concentration between the heat shield and the cooling jacket at each stage of the simulated crystal growth process as compared to the previous crystal pulling system 700. As shown in FIGS. 15, 18, 21, 24, and 27, the gas flow barrier 1104 significantly reduces the flow of gas upward from the melt to between the heat shield and the cooling jacket, and reduces the SiO gas concentration between the heat shield and the cooling jacket at each stage of the simulated crystal growth process as compared to the crystal pulling system 1200 without a gas flow barrier. The gas flow barrier 1104 thereby reduces the rate of particulate deposition on the cooling jacket and, consequently, reduces the likelihood of particulate shedding and loss of CZ crystal structure during the crystal growth process.

Figure 28:
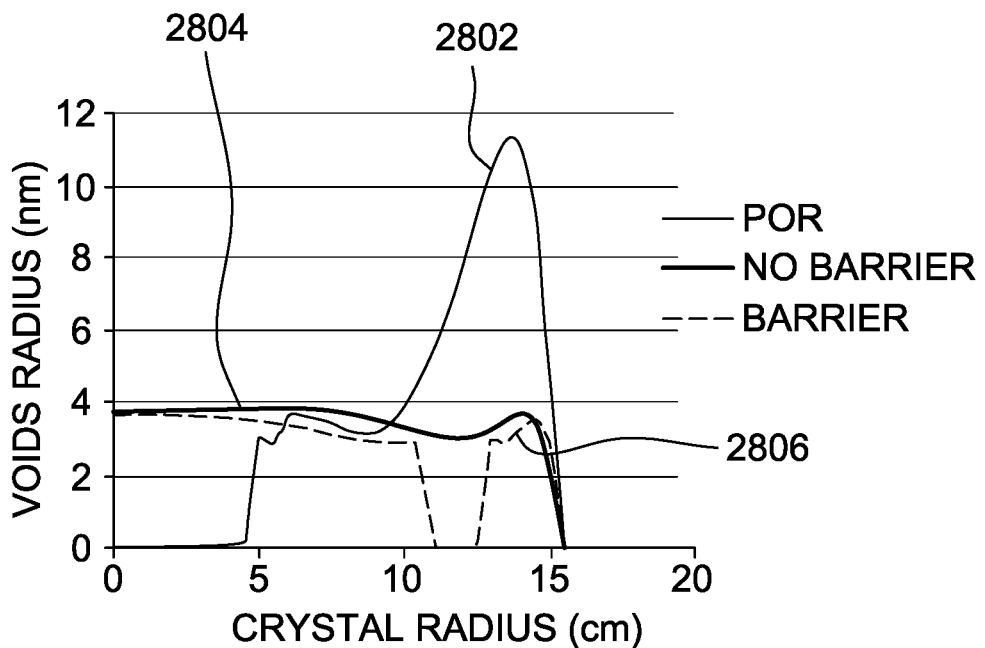
FIG. 28 is a plot illustrating simulated radial profiles of average void radius for crystal ingots grown using the crystal pulling systems shown in FIGS. 7, 11, and 13-27.

FIG. 28 is a plot illustrating simulated radial profiles of the average void radius for crystal ingots grown in the crystal pulling systems 700, 1100, and 1200 shown in FIGS. 7, 11, and 14, respectively. Line 2802 indicates the simulated radial profile of the average void radius for a crystal ingot grown in the crystal pulling system 700 shown in FIG. 7, line 2804 indicates the simulated radial profile of the average void radius for a crystal ingot grown in the crystal pulling system 1200 shown in FIG. 14, and line 2806 indicates the simulated radial profile of the average void radius for a crystal ingot grown in the crystal pulling system 1100 shown in FIG. 11.

Figure 29:
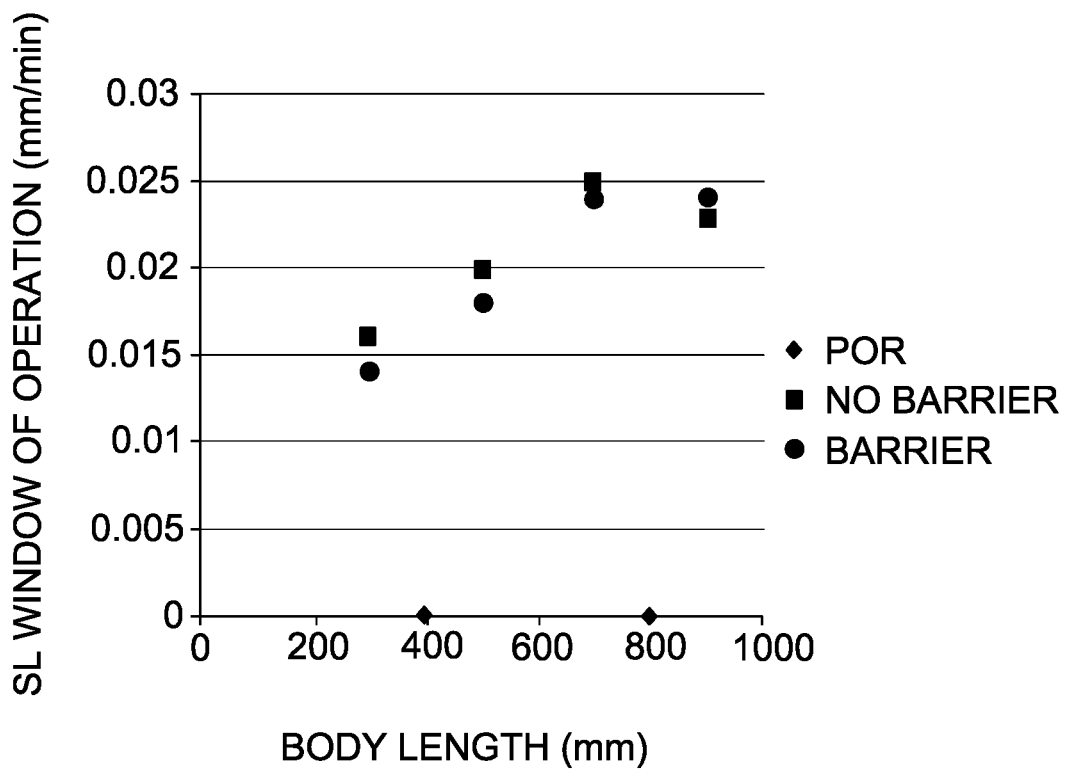
FIG. 29 is a plot illustrating the seed lift window of operation at a given body length of a growing crystal in the crystal pulling systems shown in FIGS. 7, 11, and 13-27.

FIG. 29 is a plot illustrating the seed lift window of operation (i.e., acceptable variation in seed lift rate) at a given body length of a growing crystal in the crystal pulling systems 700, 1100, and 1200 shown in FIGS. 7, 11, and 14, respectively. As shown in FIGS. 28 and 29, the addition of the gas flow barrier 1104 had no significant effect on either the reduction of defect sizes in the edge band of the crystal or the process window of operation.

The systems and methods described herein are suitable for use in growing a variety of different types and sizes of monocrystalline ingots. The systems and methods described herein are particularly suitable for growing ingots having a diameter of between about 150 mm to about 450 mm, and having an initial feedstock charge size of between about 150 kilograms (kg) and about 450 kg. Ingots having diameters less than 150 mm or greater than 450 mm, or charge sizes other than between about 150 kilograms (kg) and about 450 kg may also be grown using the systems and methods disclosed herein. Further, the systems and methods described herein are suitable for use in growing nitrogen-doped crystal ingots. The nitrogen concentration of ingots grown using the systems and methods described herein may range from 0 cm$^{-3}$ to about 1×10$^{15}$ cm$^{-3}$.

Embodiments of the crystal pulling systems and methods described herein provide several advantages over known crystal pulling systems and methods. In particular, embodiments described facilitate reducing the size and concentration of defects that form the grown-in defect edge band in monocrystalline ingots grown by the Czochralski method, such as single crystal silicon ingots. In particular, some systems and methods described facilitate reducing the concentration and/or the size of defects incorporated into the crystal ingot during growth by reducing and/or controlling the lateral incorporation and transport of defects, such as vacancies and oxygen impurities, as the crystal ingot is grown from a melt. Embodiments described may also facilitate reducing the size of defects in crystal ingots by reducing and/or controlling the nucleation of agglomerated defects, such as voids and oxygen precipitates, as the crystal ingot is grown. Also, these embodiments may facilitate reducing and/or controlling lateral incorporation and nucleation of defects by controlling the cooling rate of the ingot and by controlling the profile of the melt/crystal interface during growth of the crystal. Some systems and methods described use a multi-stage cooling system that subjects the ingot to multiple different cooling rates as the ingot is pulled from the melt. Use of the multi-stage cooling system facilitates precisely controlling the various transport and nucleation mechanisms of defects at various stages of crystal growth, and thereby facilitates reducing the size and/or concentration of defects incorporated into the crystal during growth. Moreover, the present disclosure provides a method for determining a desired or target melt/crystal interface profile for reducing and/or controlling lateral incorporation of defects, and for controlling process parameters during crystal growth to achieve the desired melt/crystal interface profile.

Additionally, embodiments of the crystal pulling systems and methods described facilitate reducing particulate deposition within the crystal pulling system by controlling and/or inhibiting the flow of gas within certain portions of the crystal pulling system. Some embodiments, for example, include a gas flow barrier that inhibits the flow of SiO-containing gas to between a cooling jacket and a heat shield of the multi-stage cooling system that may otherwise result in excessive SiO deposits along the cooling jacket.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A method of growing a monocrystalline ingot from a melt of a semiconductor or solar-grade material, the method comprising:
    preparing the melt of the semiconductor or solar-grade material in a crucible;
    lowering a seed crystal into contact with the melt to initiate growth of the monocrystalline ingot;
    growing the monocrystalline ingot by pulling the seed crystal away from the melt; and
    controlling a cooling rate of the monocrystalline ingot by pulling the monocrystalline ingot through a multi-stage heat exchanger, the multi-stage heat exchanger includes a fluid-cooled housing defining a central passage for receiving the monocrystalline ingot, the fluid-cooled housing has an upper portion and a lower portion spaced vertically from the upper portion by an annular gap, the fluid-cooled housing includes a cooling tube disposed within an interior chamber of the fluid-cooled housing, the cooling tube extends from the upper portion into the lower portion and includes an interconnecting member connecting the cooling tube in the upper portion with the cooling tube in the lower portion, the cooling tube within the upper portion defines an opening;
    exhausting the cooling fluid from the cooling tube through the opening into the interior chamber of the fluid-cooled housing; and
    channeling the cooling fluid exhausted from the cooling tube from the upper portion to the lower portion through the interconnecting member, wherein controlling the cooling rate includes:
    cooling an axial segment of the monocrystalline ingot at a first by channeling a cooling fluid through the cooling tube within the lower portion, initial cooling rate as the monocrystalline ingot is pulled from melt;
    cooling the axial segment of the monocrystalline ingot at a second cooling rate less than the first cooling rate as the monocrystalline ingot is pulled from the melt; and
    cooling the axial segment at a third cooling rate greater than the second cooling rate as the monocrystalline ingot is pulled from the melt by channeling the cooling fluid through the cooling tube within the upper portion.

2. The method of claim 1 further comprising:
    determining a target melt/crystal interface profile for the monocrystalline ingot based on at least one of a desired defect size profile and a desired defect concentration profile; and
    controlling at least one process parameter to control the profile of the melt/crystal interface of the monocrystalline ingot based on the target melt/crystal interface profile.

3. The method of claim 2, wherein controlling the at least one process parameter includes controlling a rotation rate of the seed crystal based on the target melt/crystal interface profile.

4. The method of claim 2, wherein determining the target melt/crystal interface profile includes determining the target melt/crystal interface profile based on a hot zone configuration of a crystal pulling system in which the monocrystalline ingot is grown.

5. The method of claim 1, wherein the first cooling rate is at least 2° C./minute.

6. The method of claim 1, wherein the second cooling rate is between 0.5° C./minute and 1.5° C./minute.

7. The method of claim 1, wherein the third cooling rate is at least 1.5° C./minute.

8. The method of claim 1, wherein the axial segment of the monocrystalline ingot is cooled at the first cooling rate within a temperature range of about 1410° C. to about 1100° C., the axial segment of the monocrystalline ingot is cooled at the second cooling rate within a temperature range of about 1100° C. to about 900° C., and the axial segment of the monocrystalline ingot is cooled at the third cooling rate within a temperature range of about 900° C. to about 600° C.

9. The method of claim 1, wherein growing the monocrystalline ingot by pulling the seed crystal away from the melt comprises growing the monocrystalline ingot by pulling the seed crystal away from the melt through an annular heat shield positioned concentric with the crucible and defining an elongate passage for receiving the monocrystalline ingot.

10. The method of claim 9, wherein the multi-stage heat exchanger is positioned within the elongate passage defined by the annular heat shield.

11. The method of claim 9, wherein the annular heat shield is positioned radially outward from the fluid-cooled housing of the multi-stage heat exchanger.

12. The method of claim 9, wherein the annular heat shield is oriented to reflect heat towards the monocrystalline ingot through the annular gap defined by the fluid-cooled housing.

13. The method of claim 9, wherein the multi-stage heat exchanger includes a quartz baffle positioned within the annular gap defined by the fluid-cooled housing and connected to the upper portion and the lower portion.

14. The method of claim 13, wherein the quartz baffle is configured to inhibit gas flow through the annular gap.

15. The method of claim 9, wherein a gas flow barrier extends under the lower portion of the fluid-cooled housing and between the lower portion of the fluid-cooled housing and the melt such that an annular opening is defined between the gas flow barrier and the lower portion of the fluid-cooled housing.

16. The method of claim 15, wherein the gas flow barrier is connected to a lower end of the annular heat shield and extends radially inward from the annular heat shield and under the lower portion of the fluid-cooled housing.

17. The method of claim 1, the method further comprising directing the cooling fluid exhausted from the cooling tube through the interior chamber of the fluid-cooled housing.

18. The method of claim 17, wherein directing the cooling fluid exhausted from the cooling tube through the interior chamber of the fluid-cooled housing comprises directing the cooling fluid exhausted from the cooling tube through the interior chamber of the fluid-cooled housing using baffles.

19. The method of claim 17, wherein directing the cooling fluid exhausted from the cooling tube through the interior chamber of the fluid-cooled housing comprises directing the cooling fluid exhausted from the cooling tube to an outlet port defined in the fluid-cooled housing.

* * * * *